United States Patent [19]

Alexandres et al.

[11] Patent Number: 5,144,248

[45] Date of Patent: Sep. 1, 1992

[54] METHOD AND APPARATUS FOR MEASURING THE VOLTAGE AND CHARGE OF A BATTERY

[75] Inventors: Richard B. Alexandres, Clear Lake; Dennis P. Kindschuh, Mason City, both of Iowa; Larry Hall, Kansas City, Mo.; Perry B. Peden, Lenexa, Kans.; Larry Klusman; Steve Potratz, both of Lenexa, Kans.

[73] Assignee: Alexander Manufacturing Company, Mason City, Iowa

[21] Appl. No.: 355,679

[22] Filed: May 22, 1989

[51] Int. Cl.$^5$ ............................................. G01N 27/27
[52] U.S. Cl. ................................. 324/428; 324/433; 324/435; 324/436; 340/636
[58] Field of Search ............... 324/426, 427, 428, 435, 324/436, 433, 430; 340/636; 320/48

[56] References Cited

U.S. PATENT DOCUMENTS

| | | | |
|---|---|---|---|
| 4,390,841 | 6/1983 | Martin et al. | 324/427 |
| 4,558,281 | 12/1985 | Codd et al. | 324/427 X |
| 4,575,679 | 3/1986 | Chung et al. | 324/427 |
| 4,678,998 | 7/1987 | Muramatsu | 324/427 |
| 4,719,427 | 1/1988 | Morishita et al. | 324/427 |
| 4,849,700 | 7/1989 | Morioka et al. | 324/427 |
| 4,876,513 | 10/1989 | Brilmyer et al. | 324/427 |

FOREIGN PATENT DOCUMENTS 1437025  5/1976  United Kingdom ............... 324/427

Primary Examiner—Kenneth A. Wieder
Attorney, Agent, or Firm—Hugh D. Jaeger

[57] ABSTRACT

Method and apparatus for measuring the voltage and state of charge of a secondary battery. The voltage and state of charge values are taken by a circuit every four (4) seconds by reading voltage, waiting two (2) seconds, reading current, waiting two (2) seconds, and repeating the voltage readings and the current readings. The circuit includes a 4-bit microprocessor, CMOS analog switches, and two operational amplifiers. The voltage and current readings are taken from dual-sloped converters, and the values determined by software algorithms in the microprocessor.

2 Claims, 12 Drawing Sheets

METHOD AND APPARATUS FOR MEASURING THE VOLTAGE AND CHARGE OF A BATTERY

BACKGROUND OF THE INVENTION

1. Field of the Invention

The present invention pertains to a system for reading the voltage and state of charge of a battery. This system can be built into the battery including an LCD display, can be connected to the battery, or connected between a battery and a charging system.

2. Description of the Prior Art

Prior art systems have read battery voltage, but have not accurately measured current consumed or current added to a battery, and displayed this particular measurement.

Present day secondary batteries, such as Video Tape Recorder (VTR) batteries, need an accurate display of voltage, as well as current consumed, so that a battery is not run down to below recommended voltage or current during a video operation.

There is a need in secondary batteries to have a concise display indicating voltage of the battery, as well as current consumed or current added. There is a further need to indicate when a secondary battery is fully charged, is discharged, is being recharged, or is going through an automatic recharge cycle.

The prior art has been lacking in systems to indicate the state of a battery, and especially any systems which are built into the battery itself.

The present invention overcomes the disadvantages of the prior art by providing a system to read the voltage of a battery and the degree of discharge of the battery.

SUMMARY OF THE INVENTION

The general purpose of the present invention is to provide a system designed to read the voltage and status of charge of a battery. Voltage and current readings are taken every four (4) seconds when the voltage is read, two (2) seconds elapses, the current is read, two (2) seconds elapses, the voltage is read, and the steps are repeated by way of example and for purposes of illustration only and not to be construed as limiting of the present invention. The voltage readings on the display are an average of the last sixteen (16) seconds. This reduces the rounding errors of the readings and increases the apparent resolution. The electronics can read battery voltages from 4.8 volts to 19.9 volts by way of example and for purposes of illustration only and not to be construed as limiting. The current readings are integrated for display to show the amount of current consumed from the battery. The maximum reading that can be displayed is 9.999 Amp/hr. At that point, the system in this example rolls over and starts counting from zero again. An LCD shows how much more current is needed to bring the battery up to a full charge. When the battery is fully charged, a short pulse is outputted from the microcomputer to switch the charger into a trickle charge mode to protect against over charging. A self-calibration is performed when the unit is reset and every minute thereafter. This allows the unit to be manufactured without any adjustment pots or selected components which significantly reduces production time and overall cost.

The system has several options which can be enabled. The unit may display only voltage, current or charge status at each sample. These modes also allow the electronics to be easily tested in the manufacturing process.

The system is designed to be a low-cost, accurate measuring device. The absolute accuracy depends on the exact input voltage to each of the dual-sloped converters. The algorithms are executed by a 4-bit processor which performs the measurements at four (4) second intervals for the voltage and current. Therefore, a voltage or current conversion and the calculations associated with the conversions are performed every two (2) seconds. The accuracy integrated over time for current is excellent and the apparent accuracy for voltage is increased by averaging the previous four (4) readings in the software.

According to one embodiment of the present invention, there is provided a system for reading the voltage of a battery and the current consumed or added to the battery including a battery, a load across the battery, a voltage conditioner connected to the positive pole of the battery, a current conditioner connected to the negative pole of the battery, a microprocessor connected to the voltage conditioner and the current conditioner, and an LCD display connected to the microprocessor. Voltage and current readings are taken every four (4) seconds by way of example and for purposes of illustration only and not to be construed as limiting of the present invention. This information is processed by algorithms in a microprocessor and subsequently displayed on an LCD display. The microprocessor and the display can be incorporated directly within the battery housing, can be mounted on the battery or can be mounted separate from the battery.

Significant aspects and features of the present invention include a system with an LCD display which can be incorporated into a battery housing for indication of the voltage of a battery and the current consumed or added to the battery. This is especially beneficial for larger batteries, such as for video television recorders (VTR) and other batteries which require the additional monitoring hardware.

Another significant aspect and feature of the present invention is incorporating the system and the display into NiCad battery chargers for indicating the voltage of a battery, as well as the charge consumed or added to the battery. The system can also, on sensing a fully charged battery, switch a charger from a charge mode into a trickle charge mode, as a protection feature.

A further significant aspect and feature of the present invention is a display which indicates the condition of the battery, whether the battery is in a discharge mode, a charge mode, a ready mode, an automatic charging cycle mode, or is being recharged. The display visually indicates to a user the condition of the battery in numerics as to the voltage and charge, and also shows the state of the battery.

Having thus described the embodiments of the present invention, it is a principal object hereof to provide a system for reading the voltage and charge status of a battery.

One object of the present invention is a system including a voltage conditioner, a current conditioner, a load microprocessor, and an LCD display which can be incorporated into a battery.

Another object of the present invention is a system which can be utilized with a battery charger, such as for NiCad batteries.

A further object of the present invention is a system which can be used with any type of batteries such as lead-acid cells, gel cells, etc.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
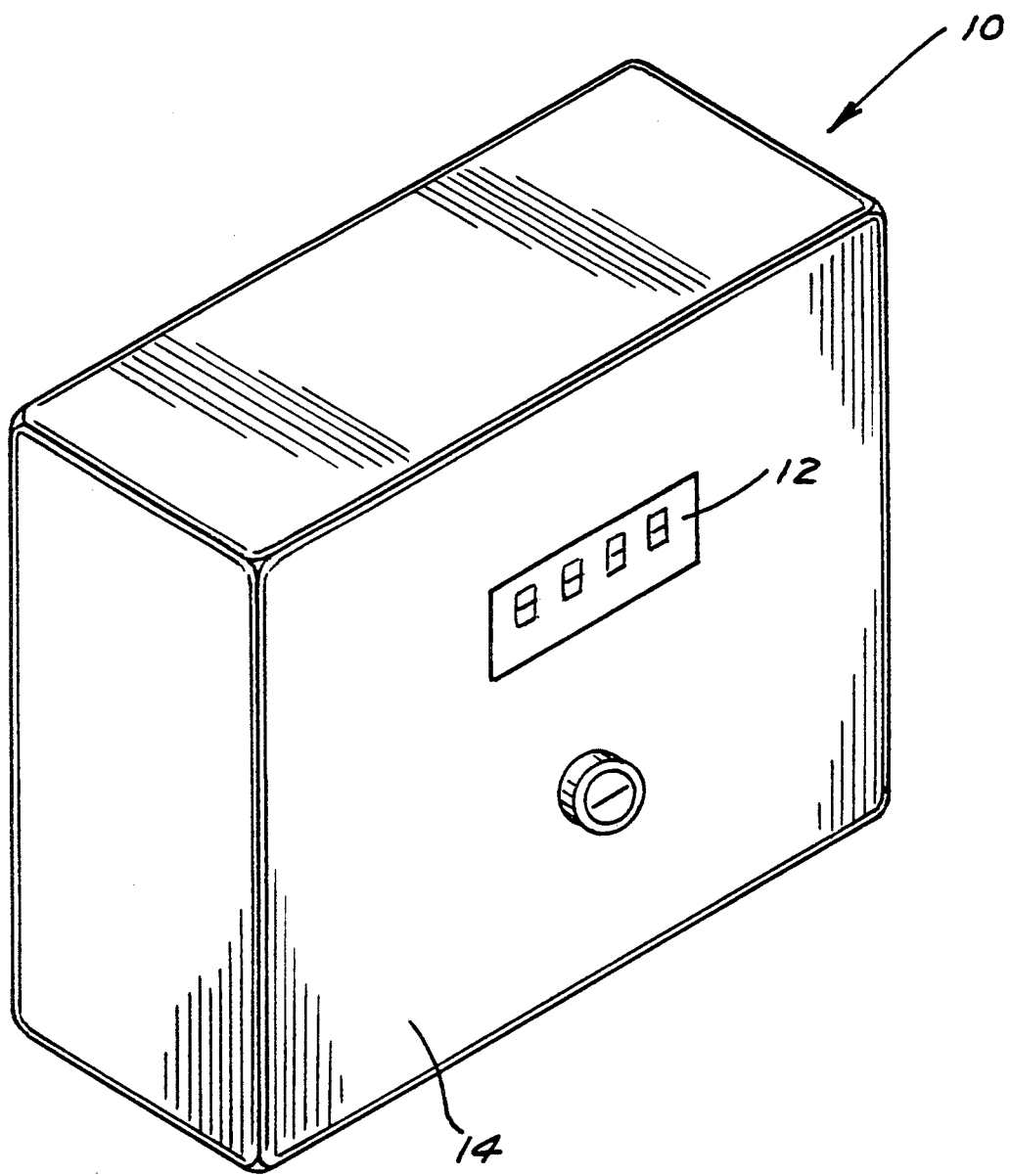
FIG. 1 illustrates a perspective view of a video television recorder battery incorporating a system for reading the voltage and charge status of the battery.

FIG. 1 illustrates a perspective view of a battery system 10 for reading the voltage and charge status of a battery, including an LCD display 12 in a video television recorder (VTR) battery 14. By mounting the monitor directly in the battery 14, it can be used as a manufacturing aid and is always available to show status throughout the battery life. LCD display 12 should be positioned for ease of visual access whenever the battery is coupled to a charger, coupled to the video television recorder in operation, or uncoupled as in transit and storage.

Figure 2:
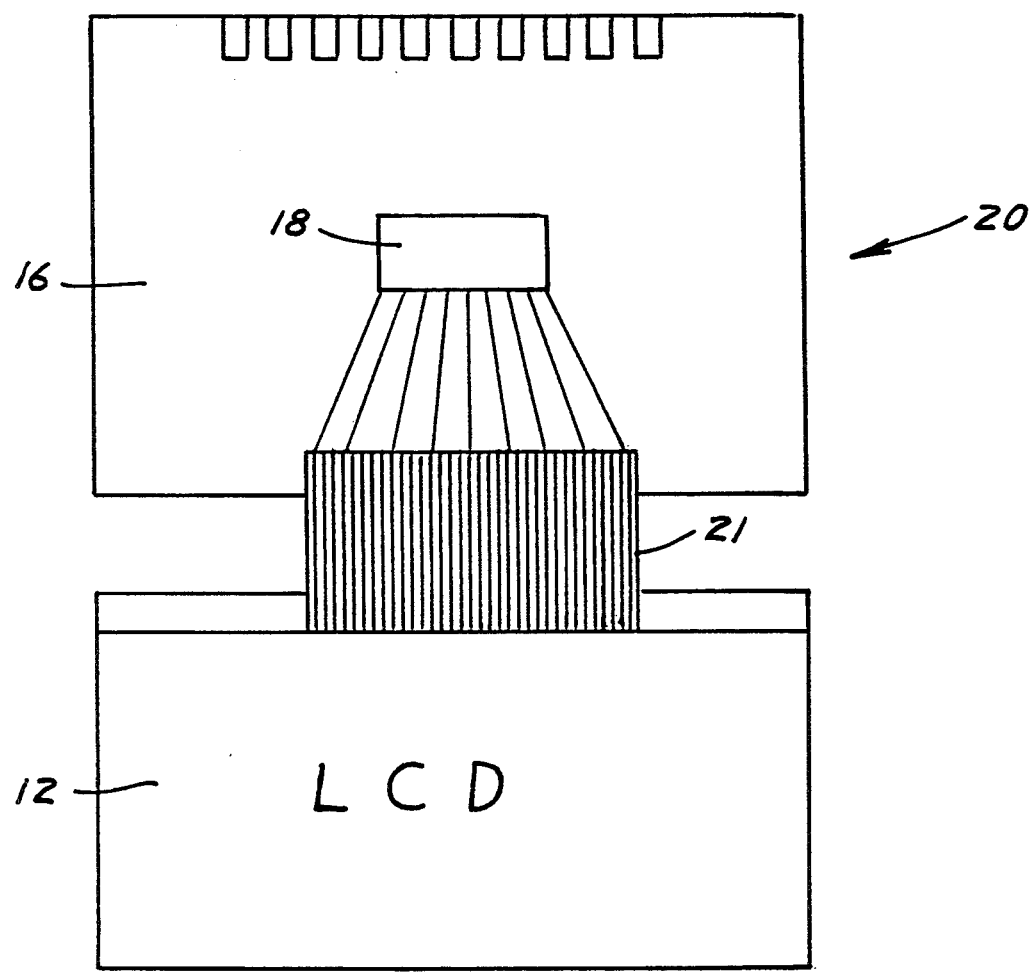
FIG. 2 illustrates a three-semiconductor system for implementing the present invention.

FIG. 2 illustrates a plan view of the system 10, including the LCD display 12 and a circuit board 16 with a microprocessor 18 thereon. A flexible cable 21 connects the LCD display 12 to the circuit board 16. This convenient three substrate system is the preferred mode of the subject invention. It permits great flexibility in placement of the element. As stated above, LCD display 12 should be placed for easy viewing during operation, charging, storage and transit. Circuit board 16, on the other hand may be placed in any available space including being imbedded out of sight of the operator.

Figure 3:
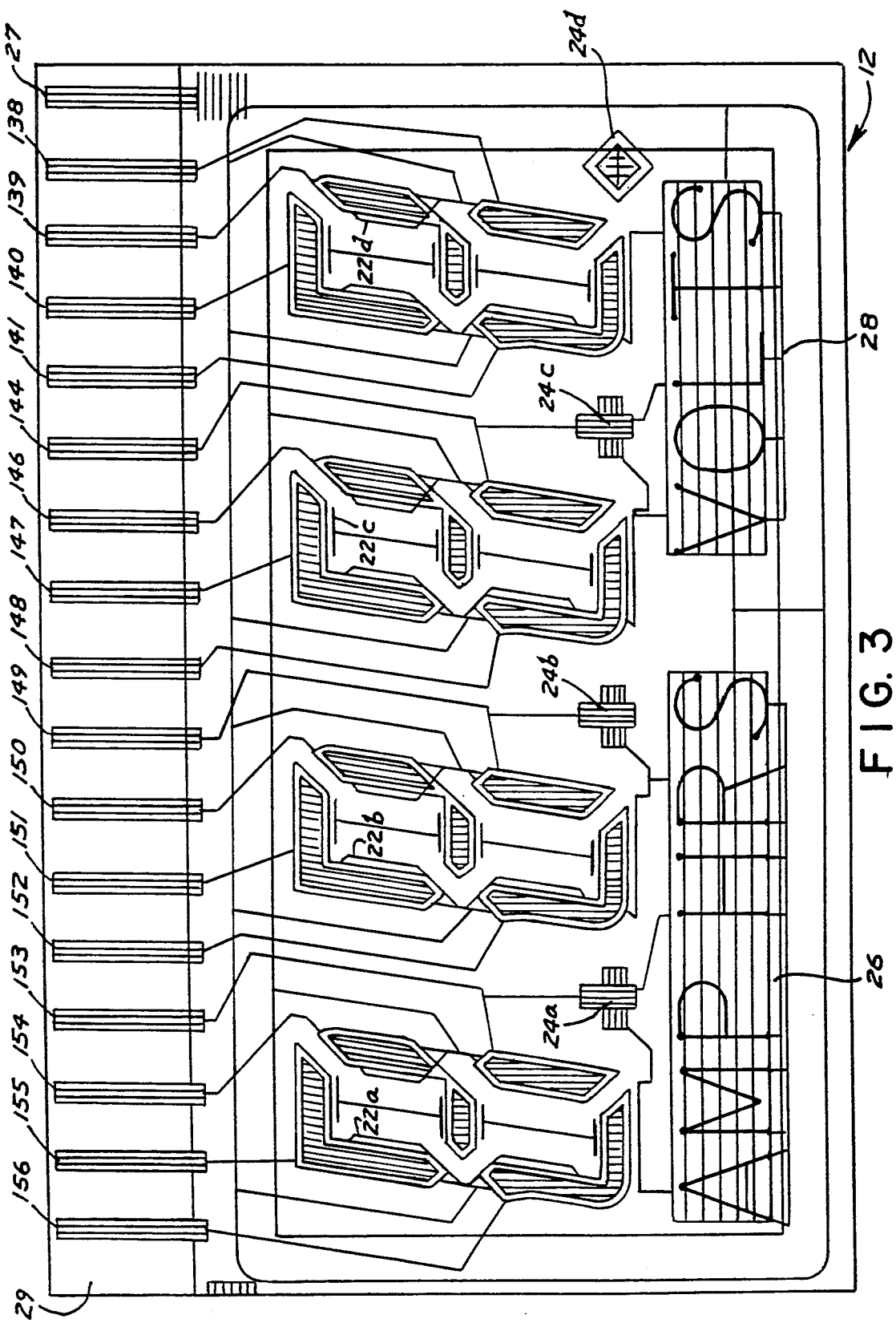
FIG. 3 illustrates a view of the display for a battery monitor incorporated into the battery.

FIG. 3 illustrates a plan view of the LCD display 12 for mounting directly on battery 14. Display 12 includes four digits 22a-22d, a floating decimal point 24a-24n, display verbiage for amp hours 26 and display verbiage for volts 28. LCD display 12 is preferably Model DCI 1067. Connector 29 couples directly to flexible cable 21 (see also FIG. 2), whereby the various elements of LCD display 12 are energized.

Figure 8:
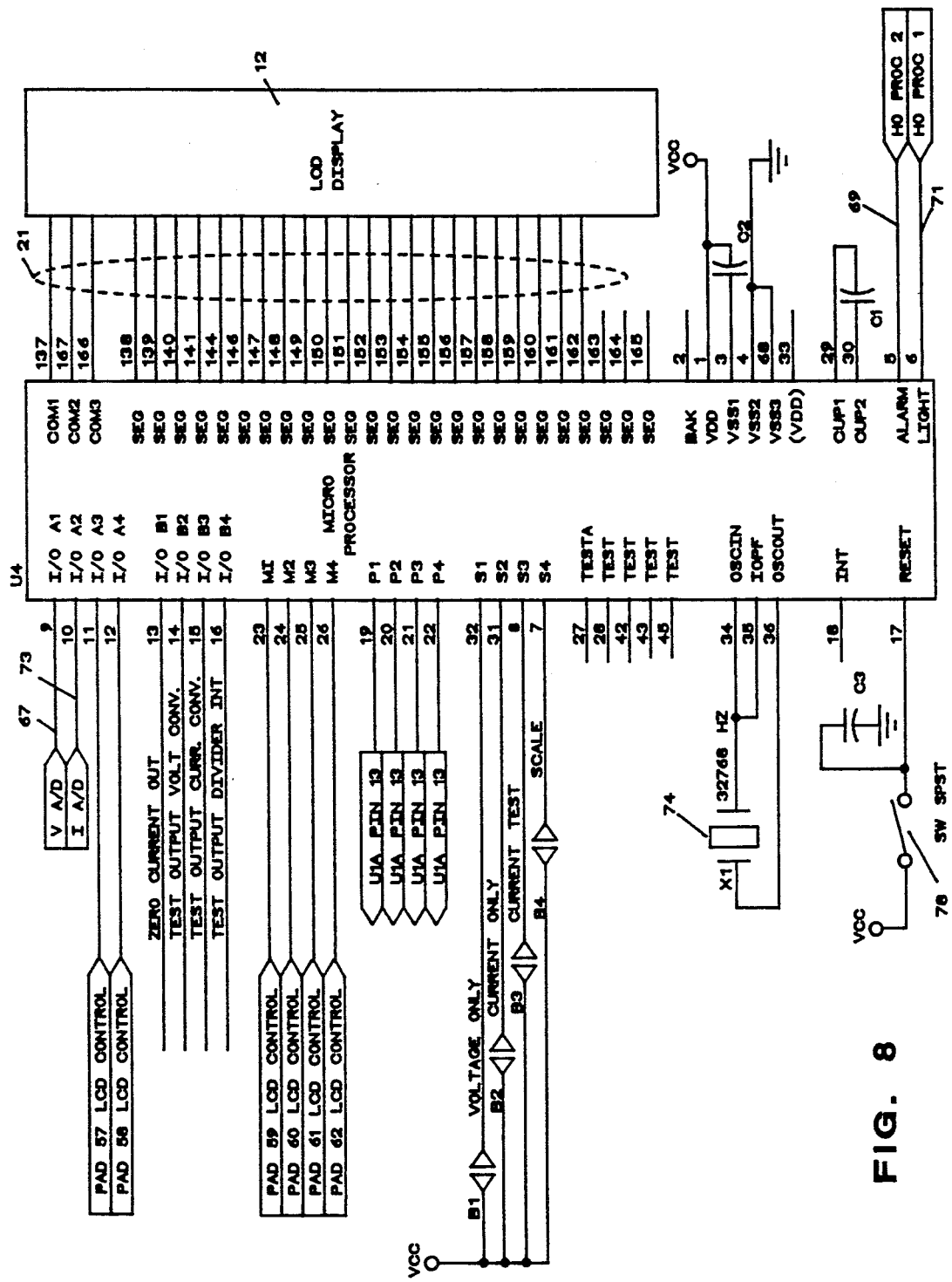
FIG. 8 illustrates the electrical circuit connections to the microprocessor.

Connector 29 contains a number of specific conductors. Conductor 27 is the common or ground connection which is coupled to system ground. Conductors 138, 141, 144, and 146-156 are coupled via flexible cable 21 to the corresponding pins of microprocessor 18 as shown in FIGS. 2 and 8.

Figure 4:
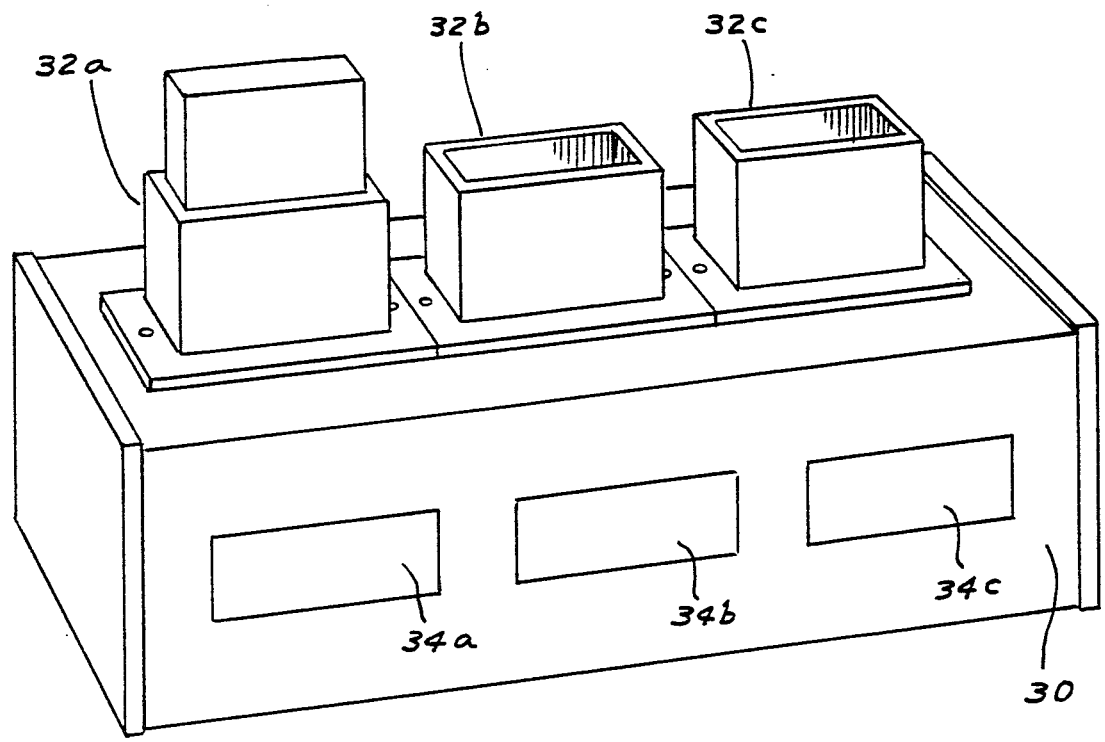
FIG. 4 illustrates the battery system for reading the voltage and charge status of each battery inserted into a battery charger.

FIG. 4 illustrates a perspective view of the battery monitoring system mounted within a battery charger 30. There is a separate monitoring system 20 for each one of the battery charging slots 32a-32c. Each of the three separate monitoring systems 20 has a separate display 34a-34c such that any battery plugged into one of the battery charging slots 32a-32c may be monitored by the corresponding display 34a-34c.

Figure 5:
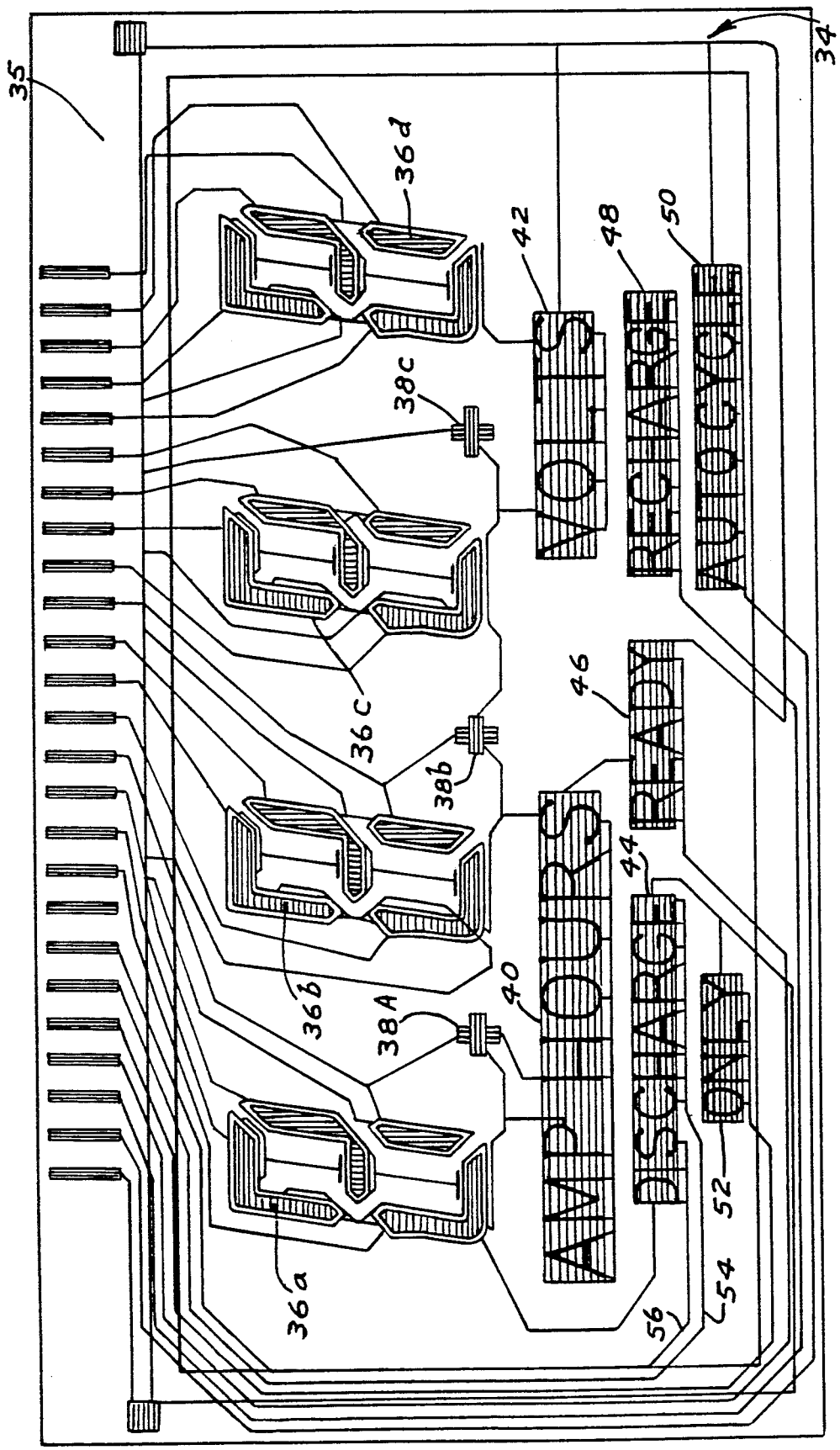
FIG. 5 illustrates an enlarged view of the display for a monitor mounted within a battery charger.

FIG. 5 illustrates a plan view of a display 34 including numbers 36a-36d, decimal points 38a-38c, and display verbiage of amp hours 40, volts 42, charge and discharge 44 in one display word, ready 46, recharge 48, autocycle 50, and only 52. The charge and discharge display verbiage 44 is connected by two illuminating wire circuits 54 and 56 so that there is a need for only one display word in two syllables on the display 34. As with LCD display 12, display 34 has a connector 35 which couples to flexible cable 21 (see also FIG. 2). Ideally, connector 35 is laid out as pin-compatible with connector 27 such that display 34 can be directly cabled via flexible cable 20 to microprocessor 18 instead of LCD display 12. The term condition can be used in lieu of the term autocycle.

Figure 6:
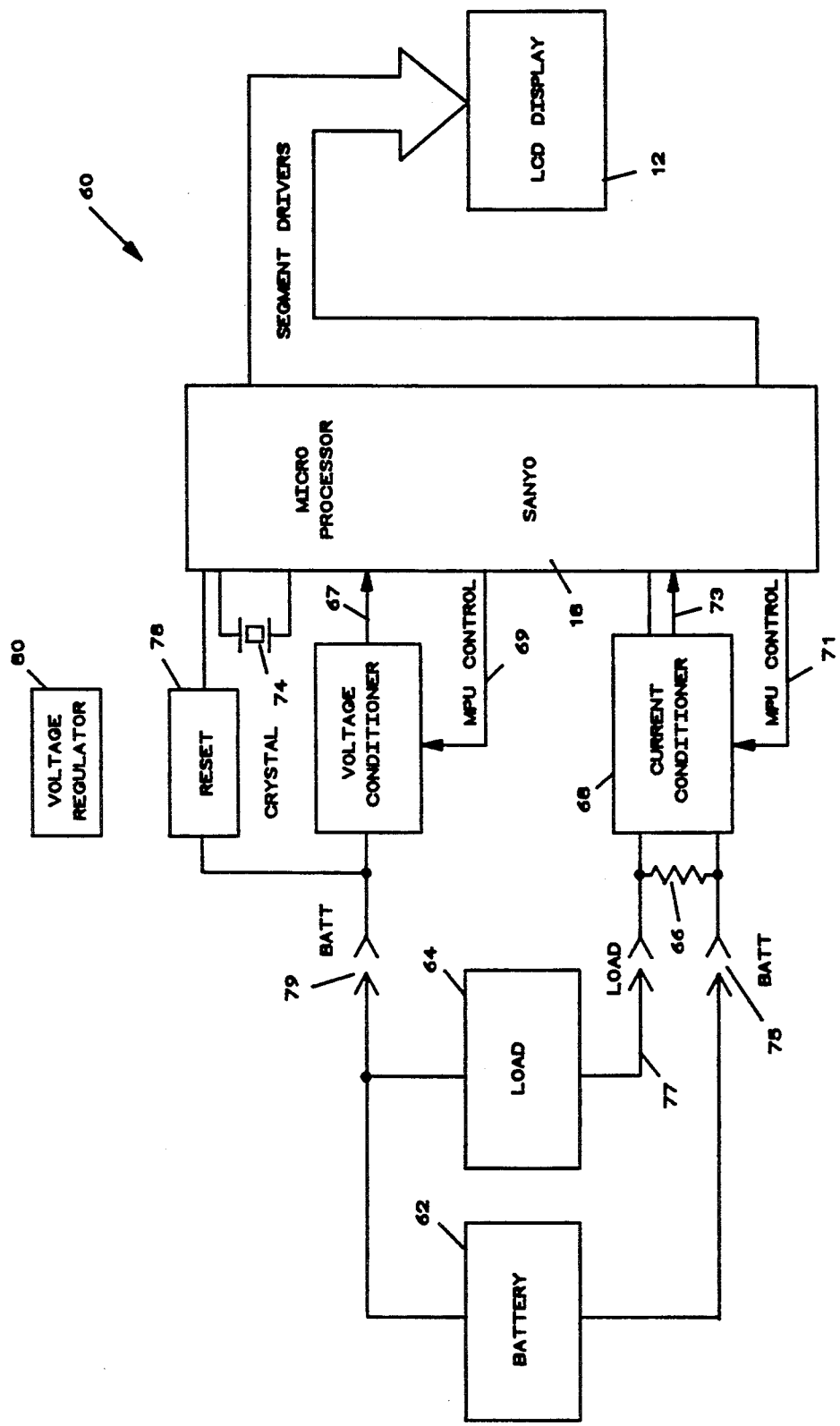
FIG. 6 illustrates a block diagram of the battery system for reading the voltage and charge status of a battery.

FIG. 6 illustrates a block diagram 60 of the battery system 10, including a battery 62, a load 64, a shunt resistor 66, current conditioner 68, a voltage conditioner 70, and microprocessor 18 with a crystal 74 which drives the LCD display 12 (or display 34 in the alternative embodiment of FIGS. 5 and 6).

In operation, battery 62 supplies power to load 64 as shown. The remaining elements are present to practice the subject invention. These components may be fixedly wired to battery 62 or may be connected via single conductor connectors 75, 77 and 79 as shown.

Insertion of connectors 77 and 75 require that all of the current flow between battery 62 and load 64 flows through shunt resistor 66 or very high impedance current conditioner 68. As is generally known in the art, shunt resistor 66 is of very low resistance, but very high precision such that most of the current flow between load 64 and battery 62 flows through shunt resistor 66. Current conditioner 68 is thus a high impedance, high precision voltage measuring device for measuring the voltage drop across the very small resistance of shunt resistor 66 for essentially all of the current flow between load 64 and battery 62. This voltage measurement is easily converted into current using Ohm's law by using the resistance of shunt resistor 66. Current conditioner 68 is controlled by microprocessor 18 via line 71 and sends voltage measurements to microprocessor 18 via line 73. Current conditioner 68 is discussed in more detail below.

Voltage conditioner 70 is coupled to the positive terminal of battery 62 via connector 79. Voltage conditioner 70 measures and digitizes battery voltage as described in more detail below. Voltage conditioner 70 is controlled by microprocessor 18 via line 69 and transmits digitized voltage measurements to microprocessor 18 via line 67.

Reset 78 is single pole single throw switch which generates an interrupt to microprocessor 18 to reset the current integration process and the voltage measurement averaging as explained in more detail below. Voltage regulator 80 provides a voltage standard for comparison purposes as explained in more detail below.

Figure 7:
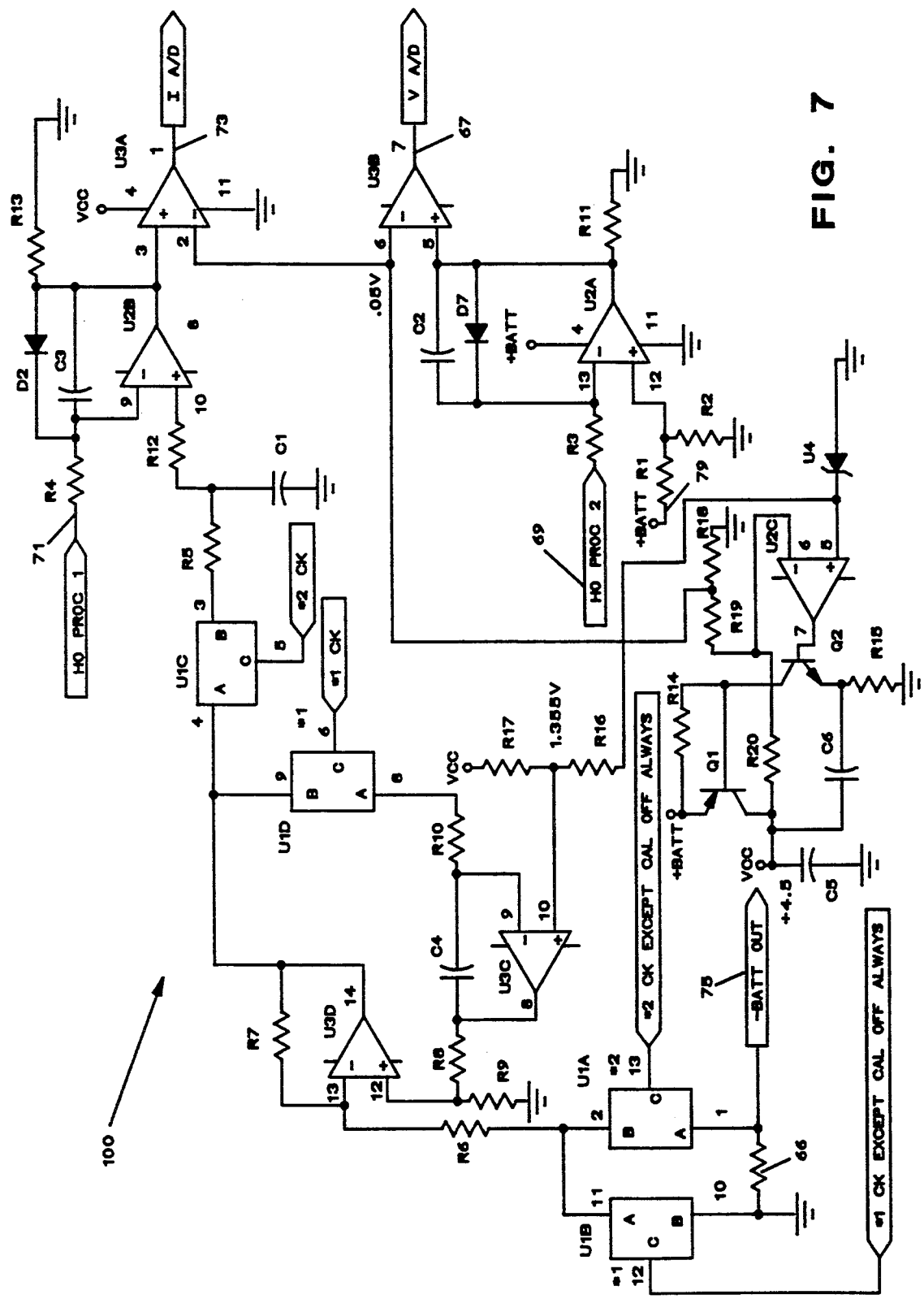
FIG. 7 illustrates a circuit diagram for the current conditioner, the voltage conditioner, and associated circuitry.

FIG. 7 illustrates the electrical circuit schematic diagram 100 of current conditioner 68, voltage conditioner 70, and voltage regulator 80.

The voltage regulator 80 includes a reference diode U4, a differential amplifier U2C, an NPN drive transistor Q2, a PNP pass transistor Q1, voltage divider R18, R19, and R20, filter capacitor C5, stabilizing capacitor C6, and biasing resistors R14 and R15.

The purpose of the voltage regulator circuit is to convert the variable battery voltage to a constant 4.5 volt value. This constant regulated voltage supplies power to the entire circuit including the microprocessor 18. It is this constant voltage driving the microprocessor control lines 69 and 73 which permits the automatic calibration of the voltage and current measurement circuitry.

The regulated output voltage is divided by R20 and the series combination of the R18 and R19 and connected to the inverting input of operational amplifier U2C. The positive input of U2C is held at a constant 1.2 volts by the reference diode U4. The difference between the divide output voltage and the reference is amplified by U2C and used to control the drive transistor Q2. Q2 then controls the pass transistor Q1 to force the output to 4.5 volts so that the amplified error voltage is zero. R18 and R19 further divide the output voltage to 0.05 volt level that is used as a trip point for the comparators U3A and U3B. The absolute accuracy of this trip point is not critical to the accuracy of the conversion.

The voltage conditioner 70 includes an operational amplifier U2A, a comparator U3B, a voltage divider R1 and R2, an integrating current set resistor R3, an integrating capacitor C2, and a protection diode D7. Resistor R11 helps the output of amplifier U2A sink more current when it is close to the negative rail.

The battery voltage is divided by resistors R1 and R2 to scale it to an appropriate level for the converter. This voltage becomes a reference to the operational amplifier U2A, and controls the integrating charge and discharge current. The integrating current set resistor R3 and integrating capacitor C2 provide an integrating function as explained below. The protection diode D7 clamps the reverse voltage on the integrating capacitor when the circuit is not in use.

The actual voltage measurement is made by observing the times at which the comparator output changes state. The output of this comparator is supplied to one of the digital inputs of the microprocessor 18 so that these times can be accurately measured. When the conversion starts, the output of the comparator is held low because the control line 69 is high. When the conversion starts, this control line 69 is taken low and the integration capacitor 62 starts charging with the current created by the input reference voltage divided by resistor R3. When the output of the integrator passes the 0.05 volt threshold of the comparator, the comparator output 67 goes high to signal that the conversion has started and the microprocessor 18 should start timing. A fixed amount of time later, the control output 69 goes high which is the same as the 4.5 volt regulator because that is the supply to the microprocessor 18. This causes the integrating capacitor to discharge with a current of 4.5 volt minus the reference divided by resistor R3. When the integrator output passes the 0.05 volt threshold of the comparator, the output of the comparator goes low again signaling to the microprocessor 18 that the conversion is finished. The ratio of the charge time to the discharge time is mathematically representative of the ratio between the 4.5 volt reference supply and the battery voltage. By performing the appropriate mathematics, the battery voltage can be determined from the comparator output timing.

The current conditioner 68 includes shunt resistor 66 which develops voltage being measured and is a dropping resistor for current sensing. The value and precision of this resistor is critical as explained above. Shunt resistor 66 is coupled between the negative terminal of battery 62 and load 64 (see also FIG. 6). U1A and U1B are analog multiplexers. These permit calibration of the current sensor amplifier U3D. R6 sets the gain of amplifier U3D that amplifies the voltage measured across shunt resistor 66 with the negative input pin becoming a summing junction for feedback supplied by feedback resistor R7. U1C and U1D are also analog multiplexers providing switching voltages for control of the offset cycle. The current amplifier switches between offset calibration mode and signal amplification mode many times a second. In calibration mode, switches U1B and U1D are on. This sets the amplifier input to ground and enables the operational amplifier U3C to set the output of amplifier U3D to 1.355 volts. When this cycle is over, C4 holds the last voltage that set these conditions so that during the amplification mode the output of U3D is always referenced to 1.355 volts. During the amplification mode switches U1A and U1C are turned on to allow the amplified current to be sensed. Capacitor C1 stored this output when U1C opens during the calibration mode. R12 ensures that the input impedances to U2B are matched, reducing the input offset current error.

FIG. 8 illustrates the electrical circuit connections to the microprocessor 18 and between the microprocessor and the LCD display. The microprocessor is a Sanyo LC5851H 4-bit microcomputer by way of example and for purposes of illustration only, and not to be construed as limiting of the present invention. Other 4-bit microprocessors can be utilized.

Microprocessor 18 contains the digital inputs for both voltage and current measurements received via lines 67 and 73, respectively. It also contains the digital output control lines 69 and 71 for voltage and current measurement. Control of microprocessor 18 is via the software as described below.

DESCRIPTION OF THE ALTERATIVE EMBODIMENT

Figure 9A:
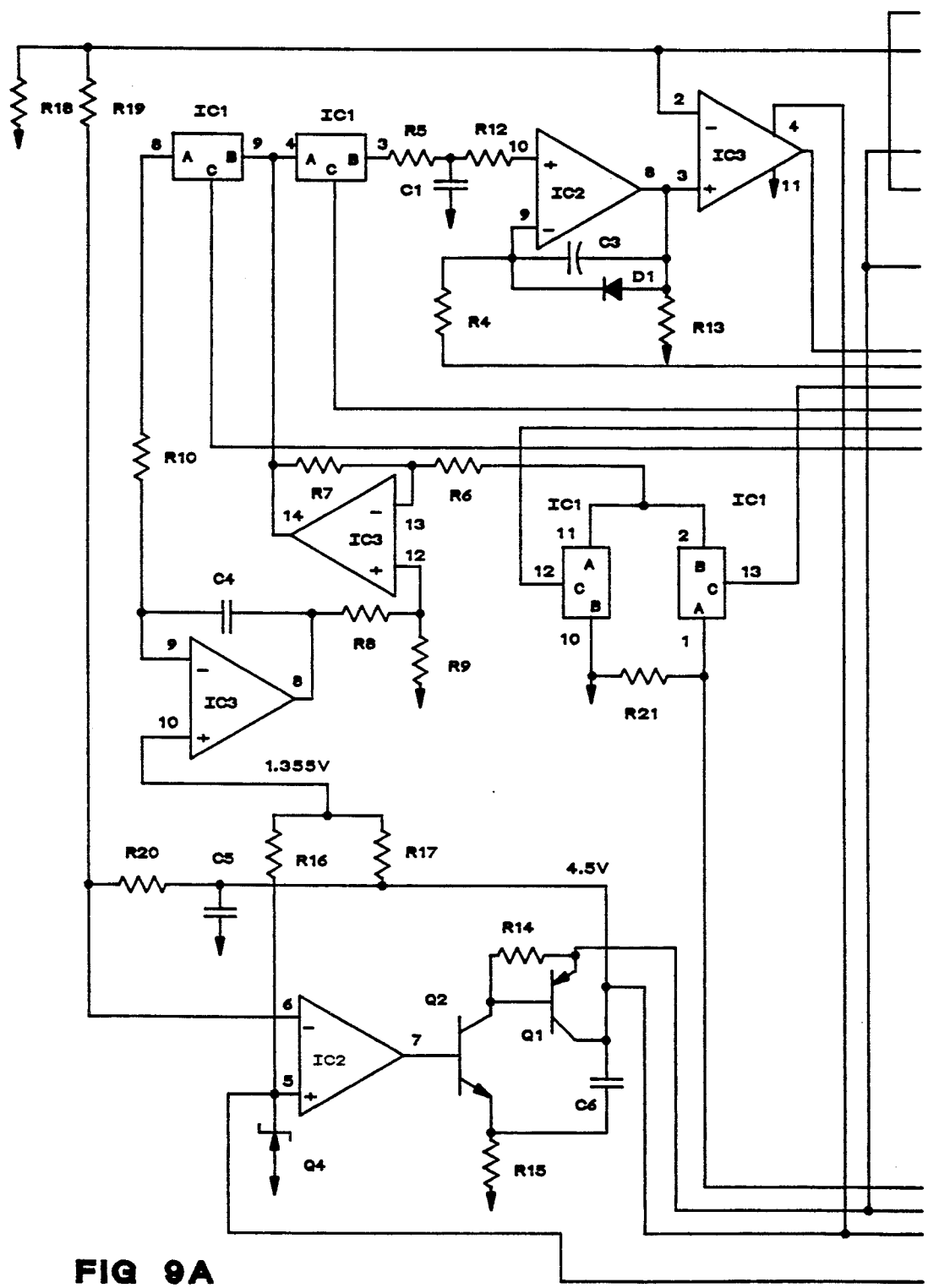
FIGS. 9A and 9B illustrate an alternative embodiment to the circuits of FIGS. 7 and 8; and, FIGS. 10A and 10B illustrate a flow chart for operation of the present invention.
Figure 9B:
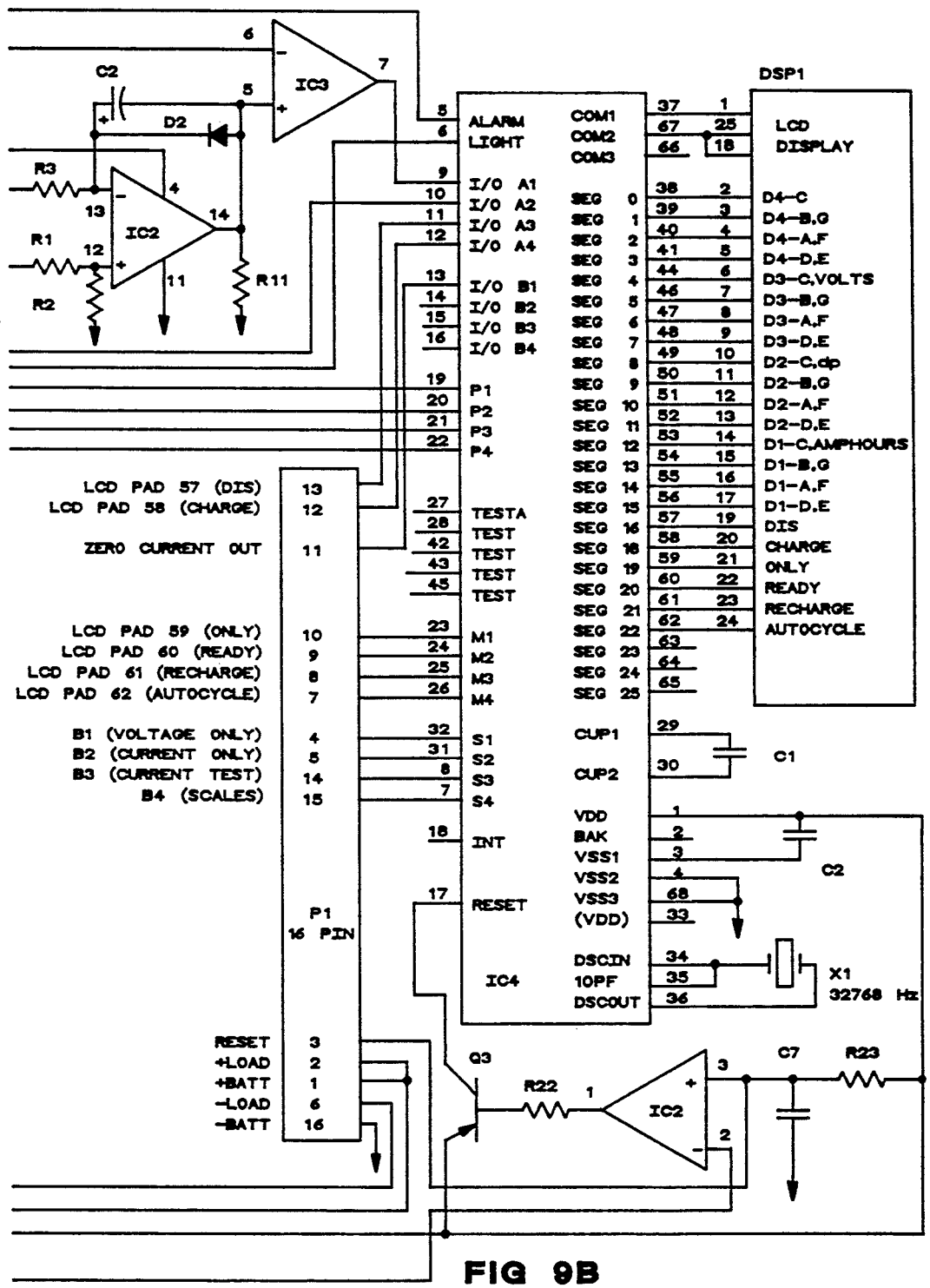

FIG. 9 illustrates an alternative embodiment of the circuits of FIGS. 7 and 8. A careful analysis will show that the circuit is nearly identical with that explained above. One key difference is the use of an automated circuit to reset the system in place of the manual reset by single pole-single throw switch 78. Referring to FIG. 9, this automatic reset circuit includes PNP drive transistor Q3, coupling resistor R22, operational amplifier IC2 and RC network C7/R23. The reset occurs automatically upon insertion of a battery. The remaining changes incorporated into the alternative embodiment are minor circuit details.

MODE OF OPERATION

The electronics and electric circuit are based on the Sanyo LC5851H 4-bit microcomputer, CMOS analog switches, and two LM324 op-amps. The voltage and current readings are taken from dual-sloped converters and the values determined by software algorithms.

Operation of the voltage dual-sloped converter is with the two LM324 op-amps. The battery voltage is input to pin 3 of U2A through a voltage divider (see FIG. 7). Pin 2 is controlled by the microprocessor to enable and disable the integration function as explained above. The output from U2A is to U3B to be compared to the fixed reference voltage. The diode across the capacitor C3 limits the reverse bias while the circuitry is not in use. The output is sent to a digital input port on the microcomputer.

The dual-sloped converter is implemented by allowing C2 to charge for a fixed period of time after which the discharge rate is determined by the voltage on U3B pin 3. The software algorithm for the voltage is:

$$\text{BATTERY VOLTAGE} = 38.3 * X/(200+x)$$

where "x" represents the number of counts the microcomputer acquired during the discharge time of the integrator. The charge time is fixed at 196 milliseconds. Each count represents 976 microseconds of discharge time.

The analog multiplexer offsets the ground reference so that positive or negative voltages from the current sense resistor can be used by the integrator. This is accomplished with the analog switches and the op-amps. The ground reference is offset by U3C which has its positive input held at 1.355 volts with a voltage reference and a voltage divider.

When the U1D analog switch is gated ON, the capacitor C4 charges to a voltage that will balance the circuit to zero volts plus the voltage reference offset. When it is gated OFF and the U1C analog switch is ON, then C1 is charged by the differential between pins 12 and 13 of U3D. U3D is a high gain amp with its positive input reference above ground. The voltage at C1 is used by the integrator U2B.

The software algorithm for current is:

$$\text{CURRENT} = 9.8 * x/(200+X)$$

where "x" represents the number of counts the microcomputer counted during the discharge time of the integrator. The charge time is fixed at 196 milliseconds. Each count represents 976 microseconds of discharge time.

The transistors Q1 and Q2, and U2C form a voltage regulator. A low voltage drop across Q1 is required to maintain regulation. This voltage regulator can operate from a minimum battery voltage of 4.8 volts while producing a 4.5 volt regulated output. This allows the circuit to operate from a 6.0 volt battery discharged to 80% of its normal output, which is what most manufacturers consider a discharged state.

Software Description

The software can be divided into four modules: Offset 200, Current 202, Voltage 204, and Display 206.

Figure 10A:
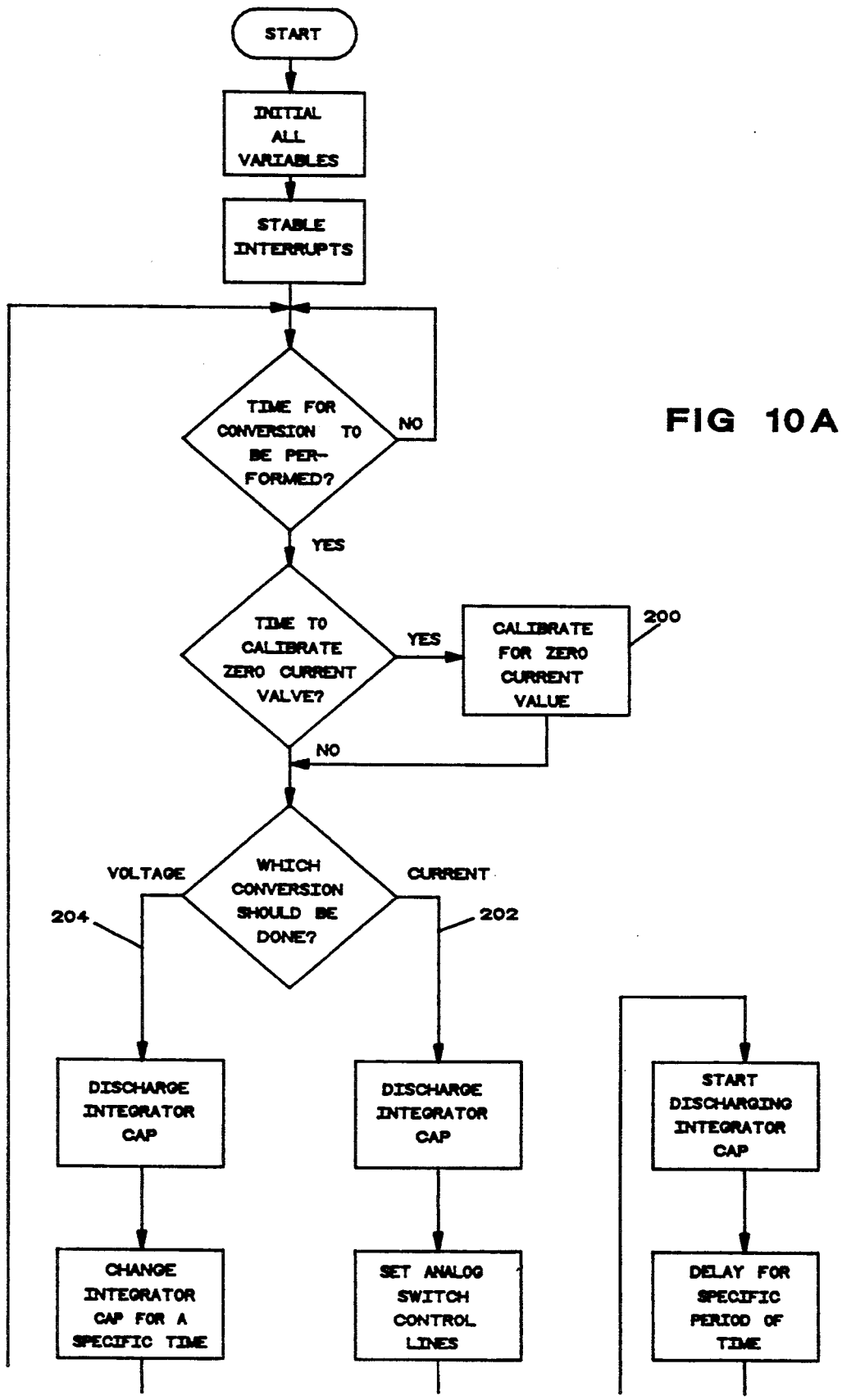
Figure 10B:
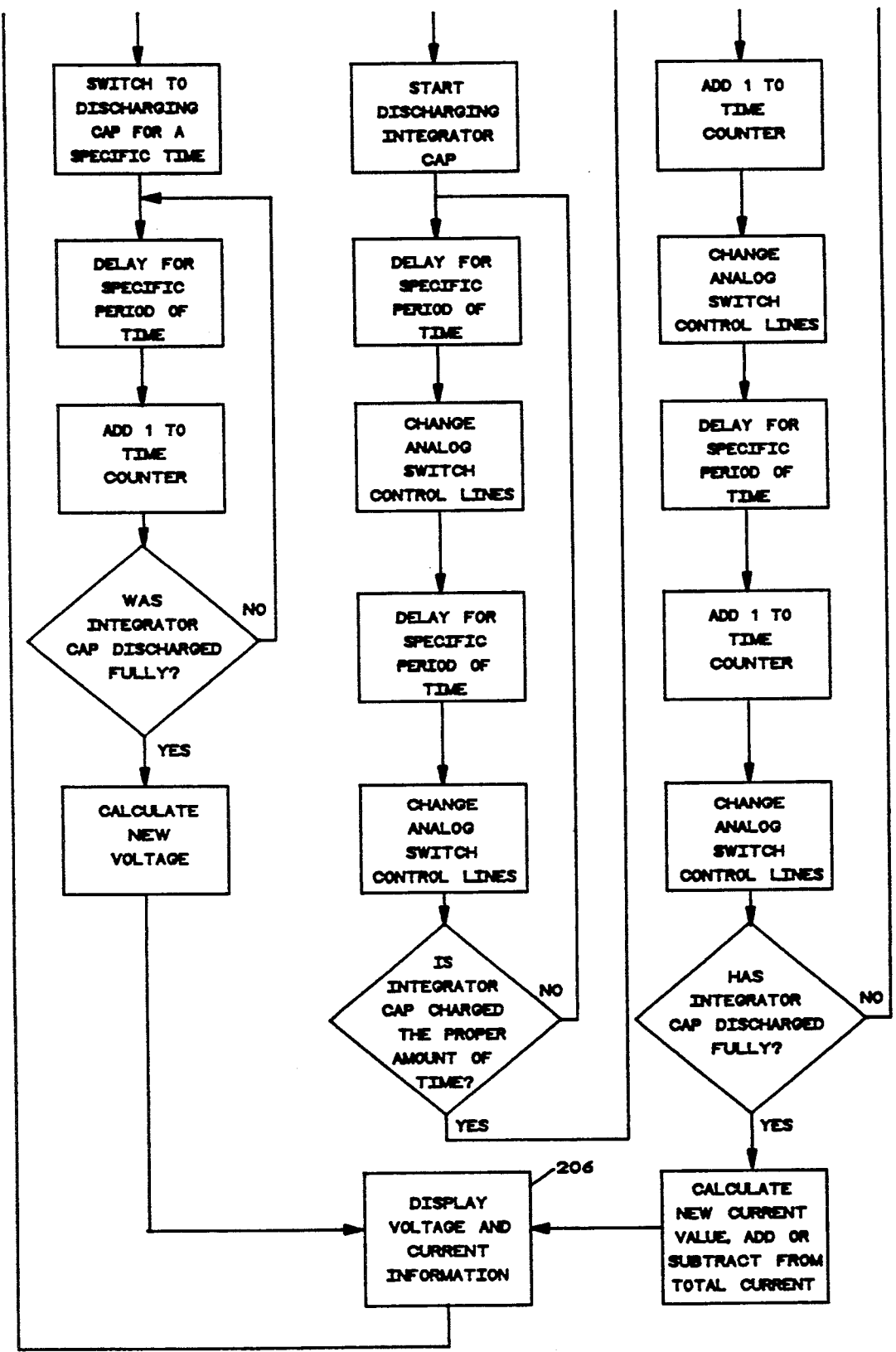

FIG. 10 illustrates the flow chart of the software.

The Offset module 200 is the first to execute. This module reads the current count for ZERO current or what might be thought of as a calibrate current. This is done so that the microcomputer knows how much to subtract from all current readings for the actual current value.

In this routine the U1A gate is not allowed ON and the U1B gate is always ON. U1C and U1D alternate states. The analog gates are activated in the following sequence: 4, 6, 4, C. This sequence reduces system noise as opposed to simply alternating the control lines, remembering the U1A is OFF and U1B is ON at all times during this routine.

The Offset module is also executed every minute to recalibrate the electronics and to average any errors from noise that may have been introduced into the system.

The Current module 202 is part of three modules which execute at all times after the Offset module. The analog gates are sequenced differently in this portion of the software than in the Offset module. The gates in this module are activated in the following sequence: 4, C, 1, 3.

The current integration is performed first, followed by the current calculation as described earlier. The direction of the current flow is determined by subtracting the value from the offset number.

The absolute value is then added/subtracted from the CONSUMED current and the absolute number is stored in registers so that in a test mode the absolute number can be displayed. If the unit has had current discharged from it when the battery charger is attached, the display will start counting toward 0.000. A short pulse from PORT B0 will be output to indicate that the CONSUMED current has reached 0.000. The charger will switch into a trickle charge mode. The display will stay at 0.000 until current is consumed from the battery.

The Voltage module 204 executes at all times after the Offset module. The voltage integration is performed and the value of the voltage is determined. The decimal number is stored.

The Display module displays the appropriate information on the display and checks for special display modes like VOLTAGE ONLY, CURRENT ONLY and CURRENT TEST. This module also calls the Offset module once every minute to recalibrate the ZERO current number. The special mode can be enabled by applying +4.5 volts on one of the following pins at a time:

S0 PORT 80=¢ display only voltage
S1 PORT 81=¢ display only current
S2 PORT 82=¢ display current for testing There are other support modules in the software which perform timings, division, multiplication and hex to bcd conversions as illustrated in the flow charts.

The source code and six sheets of flow charts for the software is attached as Appendix 1.

The display code for the LCD is attached as Appendix 2.

Various modifications can be made to the present invention without departing from the apparent scope hereof.

APPENDIX 1

```
;==============================================================================
;
;
;               DCI SANYO LC5851H PROJECT
;
;
;               JANUARY 1989
;
;
;
;==============================================================================

; * PORT DEFINITIONS
;
;       PORT P0         CONTROL #2 - OFF for calibrate, pin 13 of 4066
;            P1         CONTROL #2 - pin 5 of 4066
;            P2         CONTROL #1 - ON for calibrate, pin 12 of 4066
;            P3         CONTROL #1 - pin 6 of 4066
;
;       ALARM           HIGH OUTPUT CONTROL #2 FOR VOLTAGE
;       LIGHT           HIGH OUTPUT CONTROL #1 FOR CURRENT
;
;       PORT A0         VOLTAGE A/D INPUT
;            A1         CURRENT A/D INPUT
;            A2         input #1
;            A3         input #2
;
;       PORT M0         input #3
;            M1         input #4
;            M2         input #5
;            M3         input #6
;
;       PORT S0         DISPLAY ONLY VOLTAGE
;            S1         DISPLAY ONLY CURRENT
;            S2         DISPLAY INSTANT CURRENT
;            S3         DISPLAY SCALE NUMBERS
;
;       PORT B          bit 0 = pulse at zero current
;                       bit 1 = doing voltage conversion
;                       bit 2 = doing current conversion
;                       bit 3 = divider interupt service
;

; * RAM DEFINTIONS volt2:  equ     0       ;displayed VOLTAGE
volt1:  equ     1
volt0:  equ     2 curr6:  equ     3       ;displayed CURRENT
curr5:  equ     4
curr4:  equ     5
curr3:  equ     6       ;addend starts here
curr2:  equ     7
curr1:  equ     8
curr0:  equ     9 icur2:  equ     0bh     ;displayed instant CURRENT
icur1:  equ     0ch
icur0:  equ     0dh
isign:  equ     0eh offst3: equ     0fh     ;current offset
offst2: equ     10h
offst1: equ     11h
offst0: equ     12h avlt1:  equ     13h     ;8 registers for averaging the voltage readings
```

```
avlt0:   equ    14h bvlt1:   equ    15h
bvlt0:   equ    16h cvlt1:   equ    17h
cvlt0:   equ    18h dvlt1:   equ    19h
dvlt0:   equ    1ah ; blank space
mode:    equ    20h        ;display mode
                           ;bit 0 = 0 => displaying current
                           ;bit 0 = 1 => displaying voltage flas:    equ    21h        ;bit 0 = 1 => do a conversion
                           ;bit 1 = 1 => tell which conversion we are going to
                           ;bit 2 = 0 => first voltage reading portb:   equ    22h        ;image for port b output time:    equ    23h        ;reg for counting 2 secs to change display mode temp1:   equ    24h
temp2:   equ    25h
temp3:   equ    26h
temp4:   equ    27h
temp5:   equ    28h clkup:   equ    29h        ;clock register for current conversion outputs
clkdn:   equ    2ah        ;clock register for current conversion outputs fish1:   equ    2bh        ;registers for scale
fish2:   equ    2ch one:     equ    30h        ;register for holding 1
four:    equ    31h        ;register for holding 4
; blank space sec60:   equ    32h        ;60 second counter
bacc:    equ    33h        ;second acc
acc:     equ    34h        ;working acc
stkacc:  equ    35h        ;storage for acc
stkflg:  equ    36h        ;stoarge for flags
iacc:    equ    37h        ;interrupt acc wr0:     equ    38H        ;WORKING REGISTERS
wr1:     equ    39H
wr2:     equ    3AH
wr3:     equ    3BH
wr4:     equ    3CH
wr5:     equ    3DH
wr6:     equ    3EH
wr7:     equ    3FH

; * EQUATES sbit0:   equ    1          ;for setting bits
sbit1:   equ    2
sbit2:   equ    4
sbit3:   equ    8 rbit0:   equ    0eh        ;for resetting bits
rbit1:   equ    0dh
```

```
rbit2:   equ    06h
rbit3:   equ    07h light:   equ    04h        ;light control
sres:    equ    20h        ;port s resistor control
mres:    equ    40h        ;port m resistor control
bak:     equ    02h        ;bakup mode is controlled inton:   equ    08h        ;enable divider int.
intoff:  equ    00h        ;dis-able interrupts

; * LCD PORTS dis0:    equ    2          ;left hand digit
dis1:    equ    3
dis2:    equ    4
dis3:    equ    5          ;right hand digit
dp:      equ    6          ;decimal point
lcdflg:  equ    7          ;lcd flags
                           ;bit0 = "ma / hrs"
                           ;bit1 = "volts"

latch0:  equ    8          ;bit2 - bit 3 => from port A
latch1:  equ    9          ;bit0 - bit 3 => from port M

;---------------------------------------------------------------- begin:   org    0000h
         sic    intoff     ;make sure interrupts are off now
         call   clrdsp     ;clear display on reset
         jmp    cold org    001ch      ;1/2 divider interrupt
divint:
         sta    stkacc     ;save off the acc
         maf    stkflg     ;save off the flags ipa*   iacc       ;display external latch bits
         wrp    latch0,iacc
         ipm    iacc
         wrp    latch1,iacc
;/*test interrupt response*/
         lds    iacc,sbit3
         or*    portb      ;pulse to port b
         oiob   portb sf     sres       ;pulse resistor control
         rf     sres lds    iacc,1
         sub*   time       ;sub 1 from 4 sec counter
         banz   divret     ;jump if not zero
         lds    time,4     ;reload 2 sec counter
         lds    iacc,sbit0 ;change display mode
         eor*   mode bab0   divcnt     ;test for 4 seconds
         lds    iacc,1
         sub*   sec60      ;sub 1 from 60 second counter
         banz   divcnt     ;jump if not 60 seconds yet
         lds    sec60,0fh  ;reload counter
         lds    iacc,sbit1 ;flag mainline to do current offset adjust
         or*    mode divcnt:  lds    iacc,sbit0 ;flag main to do a conversion
         or*    flag divret:
```

```
;/*test interrupt response*/
        lds     iacc,rbit3
        and*    portb           ;pulse to port b
        oiob    portb mra     stkfls          ;restore flags
        lda     stkacc          ;restore acc
        sic     inton           ;re-enable interrupts
        rts ;--------------------------------
;
; continuation of reset code cold:   lds     acc,0           ;set port B to output
        oiob    acc
        rf      bak             ;make sure backup mode is off lds     mode,1          ;display current on reset
        lds     flag,0          ;clear flag reg on reset lds     volt2,0         ;clear voltage on reset
        lds     volt1,0
        lds     volt0,0 lds     fish2,0         ;fish scale registers
        lds     fish1,0 lds     one,1           ;register for holding 1
        lds     four,4          ;register for holding 4 call    clrcur          ;clear current registers lds     icur2,0         ;clear instant current reg on reset
        lds     icur1,0
        lds     icur0,0
        lds     isign,0
        lds     sec60,0fh       ;init 60 second counter call    a2doff          ;calibrate current
        sic     inton           ;enable interrupts ;@@@@@@@@@@@@@@@@@@@@@@@@@@@@@@@@
main:
        lda     flag            ;check for time to do a conversion
        bab0    maincv          ;jump should do a conversion
        jmp     main            ;else wait until time
maincv:
        lds     acc,rbit0       ;clear conversion flag
        and*    flag lda     mode            ;test for current offset adjust
        bab1    maincr          ;jump if time to redo offset
        jmp     mainok          ;jump if not time to do offset
maincr: call    a2doff          ;call routine that adjusts offset for current
        lds     acc,rbit1       ;turn off bit
        and*    mode mainok: ips     acc             ;test for special modes
        bab3    a2dvlt          ;special mode for scale lds     acc,sbit1       ;change which conversion we are going to do
        eor*    flag
        bab1    a2dvlt          ;jump to convert voltage
        jmp     a2dcur          ;jump to convert current date:
        lds     acc,9           ;turn off both flags, done the conversion
        and*    portb
        oiob    portb
```

```
         ips     acc             ;test for single display
         bab0    dspvlt          ;display voltage
         bab1    dspcur          ;display current
         bab2    dspicr          ;display instant current
         bab3    dspfsh          ;display weight lda     mode            ;check for display mode
         bab0    dspvlt          ;jump if displaying voltage pcur:    wrt     dis3,curr6      ;display msn of current
         wrt     dis2,curr5
         wrt     dis1,curr4
         wrt     dis0,curr3
         lds     acc,sbit1       ;display "ma/hour"
         wrp     lcdflg,acc
         lds     acc,0           ;erase dp reg
         wrp     dp,acc
         jmp     main pvlt:    wrt     dis2,volt2      ;display msn voltage
         wrt     dis1,volt1
         wrt     dis0,volt0 lds     acc,0           ;no hundreds digit, so blank digit
         wrp     dis3,acc
         wrp     dp,acc          ;erase dp reg
         lds     acc,sbit0       ;display "volt"
         wrp     lcdflg,acc
         jmp     main picr:
         wrt     dis2,icur2      ;display msn of instant current
         wrt     dis1,icur1
         wrt     dis0,icur0
         lds     acc,sbit1       ;display "ma/hour"
         wrp     lcdflg,acc
         lds     acc,0           ;erase dp reg
         wrp     dp,acc lda     isign           ;check for 'minus' sign
         baz     dspisp          ;jump if 'plus' sign lds     bacc,4          ;"-"
dspisp:  wrp     dis3,acc        ;display sign
         jmp     main dspfsh:
         call    clrwr4          ;start with wr = 0
         mrw     wr4,fish2       ;assume less than 10
         subi    wr4,10          ;sub 10
         bcnh    dspfh0          ;jump if less than 10
         sta     wr4             ;store the remainder
         lds     wr3,1 dspfh0:  mrw     wr2,fish1
         subi    wr2,10          ;sub 10
         bcnh    dspfh1          ;jump if less than 10
         sta     wr2
         lds     wr1,1 dspfh1:  wrt     dis3,wr1        ;display msn of weight
         wrt     dis2,wr2
         wrt     dis1,wr3
         wrt     dis0,wr4
         lds     acc,sbit1       ;display "ma/hour"
         wrp     lcdflg,acc
         lds     acc,0           ;erase dp reg
         wrp     dp,acc
         jmp     main
```

;end of main line loop
;@@@@@@@@@@@@@@@@@@@@@@@@@@@@@@

;--------------------------------
; SUBROUTINES

```
clrdsp: lds     acc,0               ;clear display routine
        wrp     dis3,acc
        wrp     dis2,acc
        wrp     dis1,acc
        wrp     dis0,acc
        wrp     dp,acc              ;clear decimal points
        wrp     lcdfls,acc          ;clear flags
        wrp     latch0,acc          ;external display flags
        wrp     latch1,acc
        rts clrtmp: lds     temp1,0             ;clear temp registers
        lds     temp2,0
        lds     temp3,0
        lds     temp4,0
        lds     temp5,0
        rts clrwr4: lds     wr4,0               ;clear working register area
clrwr:  lds     wr3,0
        sta     wr2
        sta     wr1
        sta     wr0
        rts clrcur: lds     curr6,0             ;clear current registers
        lds     curr5,0
        lds     curr4,0
        lds     curr3,0
        lds     curr2,0
        lds     curr1,0
        lds     curr0,0
        rts
```

;@@@@@@@@@@@@@@@@@@@@@@@@@@@@@@
;
; software for converting the current
;
```
a2dcur: ips     acc                 ;get options
        bab0    update              ;exit out if displaying only voltge
        bab3    update              ;exit out if displaying only fish scale lds     clkup,0ch           ;setup for clocks to analog switches
        lds     clkdn,03h
        lds     acc,sbit2           ;flag that conversion is happening
        or*     portb
        oiob    portb
        call    clrwr4              ;start with wr = 0 lds     wr0,2               ;clock 2 clocks to begin with
setcur: opp     four                ;flip-flop clock to converters
        opp     clkup
        nop
        nop
        nop
        nop
        nop
        nop
        nop opp     one                 ;flip-flop clock to converters
        opp     clkdn
        nop
        nop
```

```
            nop
            nop
            subi*   wr0,1
            banz    setcur sf      light
tme@I:      opp     four            ;flip-flop clock to converters
            opp     clkup
            addi*   wr2,1           ;check for max negative current
            adci*   wr1,0
            adci*   wr0,0
            bab1    ovfcur          ;count overflow for current, 512 counts
            nop
            nop
            nop opp     one             ;flip-flop clock to converters
            opp     clkdn
            nop
            nop
            nop
            nop ipa*    acc
            bab1    tme@I           ;jump if not ready to start conversion
                                    ;else start conversion sic     intoff
            rf      light
precur:     lds     wr0,0           ;registers for checking for max current
            lds     wr1,0 pre@I:      opp     four            ;flip-flop clock to converters
            opp     clkup
            nop
            addi*   wr1,1
            adci*   wr0,0
            bab3    curovr          ;count overflow for current, 128 counts
            ipa*    acc
            bab1    wtI200          ;jump if ready to start conversion opp     one             ;flip-flop clock to converters
            opp     clkdn
            nop
            nop
            nop
            ipa*    acc
            bab1    wtI200          ;jump if ready to start conversion
            jmp     pre@I           ;else loop wtI200:     lds     wr1,03h         ;set wr to 100 for 1st slope
            lds     wr0,06h         ;063h = 99, but checks for underflow wtI202:     opp     four            ;flip-flop clock to converters
            opp     clkup
            nop
            nop
            nop
            nop
            nop
            nop opp     one             ;flip-flop clock to converters
            opp     clkdn
            nop
            nop
            nop
            subi*   wr1,1           ;sub 1 from 100 count
            sbci*   wr0,0
            bch     wtI202          ;jump if has not generated a carry
```

```
            sf      light               ;start 2nd slope
nvI:        opp     four                ;flip-flop clock to converters
            opp     clkup
            addi*   wr1,1               ;add to count registers
            adci*   wr0,0               ;carry
            nop
            nop
            ipa*    acc                 ;read port bit0
            bab1    *+2                 ;jump back if still reading counts
            jmp     cmpcur              ;done with counting opp     one                 ;flip-flop clock to converters
            opp     clkdn
            addi*   wr1,1               ;add to count registers
            adci*   wr0,0               ;carry
            subi    wr0,0fh             ;check for more than 230 counts (plus some)
            baz     cmpcur              ;jump if more than 230
            ipa*    acc                 ;read port bit0
            bab1    cnvI                ;jump back if still reading counts
            jmp     cmpcur              ;done with counting ; overfow for second slope of conversion, max postive current
curovr: lds     wr1,0               ;set registers for 0 counts
        lds     wr0,0
        jmp     cmpcur ;
; overfow for first slope of conversion, max negative current
;
ovfcur: lds     wr1,0               ;set registers for 240 counts
        lds     wr0,0fh ;
; compute current
;
cmpcur: rf      light               ;make control inactive
        sic     inton
        lds     acc,0eh             ;resting state of the analog swithes
        opp     acc mrw     wr7,wr1             ;transfer time count to other registers
        mrw     wr6,wr0
        lds     wr5,0 addi*   wr7,8               ;add 200 to count
        adci*   wr6,0ch
        adci*   wr5,0               ;have denominator now ; changed the code below to 980 for CURRENT
; resolution would be 0.0x amperes ;multiply value by 980
        call    clrtmp
        mwr     temp1,wr0           ;transfer to count to temp registers
        mwr     temp2,wr1 curlp:  lds     temp3,3             ;load 980 into registers
        lds     temp4,0dh
        lds     temp5,4
        call    multpy              ;call multiply routine call    divide              ;(count * 980)/(200 + count) = current in x.
;answer is in wr0-wr4

; wr0-wr4 has instant current in decimal x.xxx lda     wr4                 ;trial subtraction to determine if negative
```

```
        sub     offst0
        sta     temp4           ;store negative or positive number lda     wr3
        sbc     offst1
        sta     temp3           ;store negative or positive number lda     wr2
        sbc     offst2
        sta     temp2           ;store negative or positive number lda     wr1
        sbc     offst3
        sta     temp1

;check for negative current, charging condition
        bcnh    negcur          ;jump if negative current lds     isign,0         ;flag for 'plus' current
        call    hexbcd          ;convert temp res. to bcd
;discharging current
        lda     wr4             ;real addition for 1/10 of current value
        add*    curr0
        bch     *+4             ;must adjust if carry
        lds     acc,10          ;decimal adjust
        sub     curr0
        bcnh    *+5
        lds     acc,10          ;decimal adjust
        sub*    curr0
        lds     acc,1
        add*    curr1 lda     wr3
        add*    curr1
        bch     *+4             ;must adjust if carry
        lds     acc,10          ;decimal adjust
        sub     curr1
        bcnh    *+5
        lds     acc,10          ;decimal adjust
        sub*    curr1
        lds     acc,1
        add*    curr2 lda     wr2
        add*    curr2
        bch     *+4             ;must adjust if carry
        lds     acc,10          ;decimal adjust
        sub     curr2
        bcnh    *+5
        lds     acc,10          ;decimal adjust
        sub*    curr2
        lds     acc,1
        add*    curr3 lda     wr1
        add*    curr3
        bch     *+4             ;must adjust if carry
        lds     acc,10          ;decimal adjust
        sub     curr3
        bcnh    *+5
        lds     acc,10          ;decimal adjust
        sub*    curr3
        lds     acc,1
        add*    curr4 lda     wr0
        add*    curr4
        bch     *+4             ;must adjust if carry
        lds     acc,10          ;decimal adjust
        sub     curr4
        bcnh    *+5
```

```
          lds      acc,10           ;decimal adjust
          sub*     curr4
          lds      acc,1
          add*     curr5 lds      acc,10           ;decimal adjust
          sub      curr5
          bcnh     *+4
          sta      curr5
          lds      acc,1
          add*     curr6 lds      acc,10           ;decimal adjust
          sub      curr6
          bcnh     *+3
call      clrcur                    ;overflow in counters
jmp       curren lda       wr4                       ;real addition for current value
add*      curr1
bch       *+4                       ;must adjust if carry
lds       acc,10                    ;decimal adjust
sub       curr1
bcnh      *+5
lds       acc,10                    ;decimal adjust
sub*      curr1
lds       acc,1
add*      curr2 lda       wr3
add*      curr2
bch       *+4                       ;must adjust if carry
lds       acc,10                    ;decimal adjust
sub       curr2
bcnh      *+5
lds       acc,10                    ;decimal adjust
sub*      curr2
lds       acc,1
add*      curr3 lda       wr2
add*      curr3
bch       *+4                       ;must adjust if carry
lds       acc,10                    ;decimal adjust
sub       curr3
bcnh      *+5
lds       acc,10                    ;decimal adjust
sub*      curr3
lds       acc,1
add*      curr4 lda       wr1
add*      curr4
bch       *+4                       ;must adjust if carry
lds       acc,10                    ;decimal adjust
sub       curr4
bcnh      *+5
lds       acc,10                    ;decimal adjust
sub*      curr4
lds       acc,1
add*      curr5 lda       wr0
add*      curr5
bch       *+4                       ;must adjust if carry
lds       acc,10                    ;decimal adjust
sub       curr5
bcnh      *+5
lds       acc,10                    ;decimal adjust
sub*      curr5
```

```
        lds     acc,1
        add*    curr6 lds     acc,10          ;decimal adjust
        sub     curr6
        bcnh    curren call    clrcur          ;rollover condition, clear current registers jmp     curren          ;done for discharging current
; end of discharging current ; start of charging current
nescur:
        lds     isign,0fh       ;flag for 'minus' current lda     offst0          ;subtraction for negative
        sub     wr4
        sta     temp4           ;store negative lda     offst1
        sbc     wr3
        sta     temp3           ;store negative lda     offst2
        sbc     wr2
        sta     temp2           ;store negative lda     offst3
        sbc     wr1
        sta     temp1

; have found difference in temp1 - temp4
        call    hexbcd
; answer in wr0 - wr4 lda     curr6           ;check for zero current
        or      curr5
        or      curr4
        or      curr3
        or      curr2
        or      curr1
        or      curr0
        baz     curren          ;exit if already at zero lda     wr4             ;subtraction for 1/10 of current value
        sub*    curr0
        bch     ncr1            ;jump if no borrow
        lds     acc,10          ;decimal adjust
        add*    curr0
        call    adjst1          ;adjust all the rest of the registers ncr1:   lda     wr3
        sub*    curr1
        bch     ncr2            ;jump if no borrow
        lds     acc,10          ;decimal adjust
        add*    curr1
        call    adjst2          ;adjust all the rest of the registers ncr2:   lda     wr2
        sub*    curr2
        bch     ncr3            ;jump if no borrow
        lds     acc,10          ;decimal adjust
        add*    curr2
        call    adjst3          ;adjust all the rest of the registers ncr3:   lda     wr1
        sub*    curr3
        bch     ncr4            ;jump if no borrow
```

```
            lds     acc,10          ;decimal_adjust
            add*    curr3
            call    adjst4          ;adjust all the rest of the registers ncr4:       lda     wr4             ;subtraction for CURRENT value
            sub*    curr1
            bch     ncr5            ;jump if no borrow
            lds     acc,10          ;decimal adjust
            add*    curr1
            call    adjst2          ;adjust all the rest of the registers ncr5:       lda     wr3
            sub*    curr2
            bch     ncr6            ;jump if no borrow
            lds     acc,10          ;decimal adjust
            add*    curr2
            call    adjst3          ;adjust all the rest of the registers ncr6:       lda     wr2
            sub*    curr3
            bch     ncr7            ;jump if no borrow
            lds     acc,10          ;decimal adjust
            add*    curr3
            call    adjst4          ;adjust all the rest of the registers ncr7:       lda     wr1
            sub*    curr4
            bch     curren          ;jump if no borrow
            lds     acc,10          ;decimal adjust
            add*    curr4
            call    adjst5          ;adjust all the rest of the registers ; end of charging current curren:
            mwr     icur0,wr4       ;transfer real current number for display if
            mwr     icur1,wr3       ;in instant current mode
            mwr     icur2,wr2
            jmp     update ;
; subroutine for adjusting the current after subtraction
;
adjst1:     lds     acc,1           ;subtract 1 from register
            sub*    curr1
            bch     adjend          ;exit if done
            lds     curr1,9 adjst2:     lds     acc,1           ;subtract 1 from register
            sub*    curr2
            bch     adjend          ;exit if done
            lds     curr2,9 adjst3:     lds     acc,1           ;subtract 1 from register
            sub*    curr3
            bch     adjend          ;exit if done
            lds     curr3,9 adjst4:     lds     acc,1           ;subtract 1 from register
            sub*    curr4
            bch     adjend          ;exit if done
            lds     curr4,9 adjst5:     lds     acc,1           ;subtract 1 from register
            sub*    curr5
            bch     adjend          ;exit if done
            lds     curr5,9 adjst6:     lds     acc,1           ;subtract 1 from register
            sub*    curr6
```

```
            bch       adjend            ;exit if done
            call      clrcur            ;done with recharge
            lds       acc,sbit0         ;tell the outside world we are at ZERO
            or*       portb
            oiob      portb
            nop
            nop
            nop
            lds       acc,rbit0
            and*      portb
            oiob      portb adjend:     rts ;
; software for converting the voltage
;
a2dvlt:
            ips       acc               ;set options
            bab1      update            ;exit out if displaying only current lds       acc,sbit1         ;flag that conversion is happening
            or*       portb
            oiob      portb sas       40H               ;turn off high output control
            call      clrwr             ;resisters for timing discharge of cap tme@V:
            addi*     wr2,1
            adci*     wr1,0
            adci*     wr0,0
            bch       cmpvlt            ;count overflow for voltage, 784 counts
                                        ;near zero volts
            nop
            nop
            nop ipa*      acc
            bab0      tme@V             ;jump if not ready to start conversion sic       intoff            ;disable interrupts for testing
            sas       0                 ;turn on high output control
wait@V:     lds       wr0,0             ;resisters for checking for max voltage
            lds       wr1,0
            lds       wr2,0 pre@V:
            addi*     wr2,1
            adci*     wr1,0
            adci*     wr0,0
            bch       vltovr            ;count overflow for voltage, 4096 counts
                                        ;1/4 second ipa*      acc
            bab0      wtV200            ;jump if ready to start conversion
            jmp       pre@V             ;else loop wtV200:     lds       wr1,03h           ;set wr to 100 for 1st slope
            lds       wr0,06h
            jmp       wtV201 wtV202:     nop                         ;delay for voltage
            nop
            nop
            nop
wtV201:     nop
            nop
```

```
        nop
        nop nop                             ;delay for voltage
        nop
        nop
        nop
        nop
        subi*   wr1,1                   ;sub 1 from 100 count
        sbci*   wr0,0
        bch     wtV202                  ;jump if has not generated a carry sas     40h                     ;start 2nd slope, DC high on ALARM pin
        lds     wr0,0                   ;clear registers
        lds     wr1,0
        jmp     cnvV0                   ;jump so we have same time cnvV:   subi    wr1,5                   ;delay for voltage
        sbci    wr0,0eh                 ;check for more than 230 counts
        bch     cmpvlt                  ;jump if more than 230
        nop
cnvV0:
        addi*   wr1,1                   ;add to count registers
        adci*   wr0,0                   ;carry
        ipa*    acc                     ;read port bit0
        bab0    cnvcnt                  ;jump back if still reading counts
        jmp     cmpvlt                  ;jump if state has changed cnvcnt: nop
        nop
        nop
        nop
        addi*   wr1,1                   ;add to count registers
        adci*   wr0,0                   ;carry
        ipa*    acc                     ;read port bit0
        bab0    cnvV                    ;jump back if still reading counts ;
; compute voltage
;
cmpvlt:
        sic     inton                   ;re-enable interrupts
        sas     0                       ;turn off DC control line
        mrw     wr7,wr1                 ;transfer time count to other registers
        mrw     wr6,wr0
        lds     wr5,0 addi*   wr7,8                   ;add 200 to count
        adci*   wr6,0ch
        adci*   wr5,0                   ;have denominator now ; changed the code below to 382.5 for Vref of 4.5 volts
; resolution would be 0.0199 volts ;multiply value by 383 (382.5 rounded) for Vref
        mwr     temp1,wr0               ;transfer to count to temp registers
        mwr     temp2,wr1 vltp:   lds     temp3,1                 ;multiply by 383
        lds     temp4,7
        lds     temp5,0fh
        call    multpy                  ;multiply by 383 call    divide                  ;(count * 383) / (200 + count) = volt in xx.x
        jmp     vltmov ;
; overfow for first slope of conversion
;
vltovr: sas     40h                     ;make control inactive
        call    clrwr4                  ;set registers for 0 counts
```

```
          sic     inton           ;re-enable interrupts
vltmov:
          lda     flag            ;check for first voltage reading
          bab2    notfrt          ;jump if not the first reading
          lds     acc,sbit2       ;set bit after first reading
          or*     flag
          mwr     avlt0,wr3       ;store initial value in all registers
          sta     bvlt0
          sta     cvlt0
          sta     dvlt0
          mwr     avlt1,wr4
          sta     bvlt1
          sta     cvlt1
          sta     dvlt1
          jmp     vltavg          ;jump to averaging code notfrt:   lda     cvlt1           ;move out the oldest data
          sta     dvlt1
          lda     cvlt0
          sta     dvlt0 lda     bvlt1
          sta     cvlt1
          lda     bvlt0
          sta     cvlt0 lda     avlt1
          sta     bvlt1
          lda     avlt0
          sta     bvlt0 mwr     avlt1,wr4       ;newest reading
          mwr     avlt0,wr3 vltavg:   call    clrwr4
          mrw     wr4,avlt1
          mrw     wr3,avlt0
          lda     bvlt1           ;start adding
          add*    wr4
          lda     bvlt0
          adc*    wr3
          adci*   wr2,0 lda     cvlt1           ;add another
          add*    wr4
          lda     cvlt0
          adc*    wr3
          adci*   wr2,0 lda     dvlt1           ;add last
          add*    wr4
          lda     dvlt0
          adc*    wr3
          adci*   wr2,0
/*for rounding above xx.5 */
          addi*   wr4,2           ;round up, will if bit1 = 1
          adci*   wr3,0
          adci*   wr2,0           ;should not overflow here lds     bacc,2
vslp:     lda     wr3             ;check for shifting a 1
          bab0    *+3
          sr0     wr4
          jmp     *+2
          sr1     wr4 lda     wr2             ;check for shifting a 1
          bab0    *+3
          sr0     wr3
          jmp     *+2
```

```
          sr1        wr3 sr0        wr2
          lds        acc,1
          sub*       bacc
          banz       avglp              ;loop until averaged, 2 times lds        temp1,0            ;transfer for bcd conversion
          lds        temp2,0
          mwr        temp3,wr3
          mwr        temp4,wr4 registers for scale
          mwr        fish1,wr3          ;registers for scale
          mwr        fish2,wr4 call       hexbcd mwr        volt0,wr4          ;transfer to permanent registers
          mwr        volt1,wr3
          mwr        volt2,wr2
          jmp        update

*
*    20 by 12 bit unsigned binary division
*
*    this routine divides the 20 bit binary number in wr0 - wr4
*    by the 12 bit binary number in wr5 - wr7. The quotient is
*    stored in wr0 - wr4. The remainder of the division will
*    be stored in temp1 - temp3. temp4 & temp5 is used as a loop counter.
*
ivide:    lds        temp4,4            ;initialize the loop counter to 20
          lds        temp5,1 lds        temp1,0            ;clear temp registers
          sta        temp2
          sta        temp3 iv1:      lda        wr4                ;shift left dividend and quotient (tricky)
          add*       wr4                ;as dividend is shifted left the quotient
          lda        wr3                ;is shifted left into wr4
          adc*       wr3
          lda        wr2
          adc*       wr2
          lda        wr1
          adc*       wr1
          lda        wr0
          adc*       wr0
          lda        temp3
          adc*       temp3
          lda        temp2
          adc*       temp2
          lda        temp1
          adc*       temp1 bch        div3               ;if carry, we have to do subtraction lda        wr7                ;do trial subtraction
          sub        temp3
          lda        wr6
          sbc        temp2
          lda        wr5
          sbc        temp1
          bcnh       div2               ;branch ahead if negative div3:     lda        wr7                ;do real subtraction
          sub*       temp3
          lda        wr6
          sbc*       temp2
          lda        wr5
```

```
             sbc*    temp1
             addi*   wr4,1           ;add 1 to quotient
div2:        lds     acc,1           ;decrement loop counter
             sub*    temp4
             lds     acc,0
             sbc*    temp5
             or      temp4
             banz    div1            ;and loop back if not done
             rts                     ;else return
*
*    hex to bcd conversion
*
*    this routine converts a 4 nibble hex number
*    passed to it in temp1 - temp4 to a 5 nibble
*    bcd number stored in wr0 - wr4.
*
hexbcd: call    clrwr4          ;clear out result area
        lda     temp1
        call    convrt
        lda     temp2
        call    convrt
        lda     temp3
        call    convrt
        lda     temp4
        call    convrt
        rts                     ;return convrt: sta     acc             ;use acc ram image for temp storage
        lds     wr6,4           ;set loop counter to 4 conlop: lda     acc
        add*    acc             ;double adni    wr4,6
        adc*    wr4
        bch     con1
        adni*   wr4,10 con1:   adni    wr3,6
        adc*    wr3
        bch     con2
        adni*   wr3,10 con2:   adni    wr2,6
        adc*    wr2
        bch     con3
        adni*   wr2,10 con3:   adni    wr1,6
        adc*    wr1
        bch     con4
        adni*   wr1,10 con4:   adni    wr0,6
        adc*    wr0
        bch     con5
        adni*   wr0,10 con5:   subi*   wr6,1           ;decrement loop counter
        banz    conlop          ;loop back if not done
        rts                     ;otherwise return
``` software for calibrating the current

```
.2doff:  ips    acc              ;set options
         bab0   offend           ;exit out if displaying only voltge
         bab3   offend           ;exit out if displaying only scale
         lds    clkup,06h        ;setup for clocks to analog switches
         lds    clkdn,0ch lds    wr0,2            ;do this 2 times
offcur:  opp    four             ;flip-flop clock to converters
         opp    clkup
         nop
         nop
         nop
         nop
         nop
         nop opp    four             ;flip-flop clock to converters
         opp    clkdn
         nop
         nop
         nop
         nop
         subi*  wr0,1
         banz   offcur sf     light            ;discharge cap here
tmeoff:  opp    four             ;flip-flop clock to converters
         opp    clkup
         nop
         nop
         nop
         nop
         nop
         nop opp    four             ;flip-flop clock to converters
         opp    clkdn
         nop
         nop
         nop
         nop ipa*   acc
         bab1   tmeoff           ;jump if ready to start conversion
                                 ;else loop, ready to start conversion sic    intoff
         rf     light
preoff:  opp    four             ;flip-flop clock to converters
         opp    clkup
         nop
         nop
         nop
         nop
         ipa*   acc
         bab1   wt0200 opp    four             ;flip-flop clock to converters
         opp    clkdn
         nop
         nop
         nop ipa*   acc
         bab1   wt0200           ;jump if ready to start conversion
         jmp    preoff           ;else loop
t0200:   lds    wr1,03h          ;set wr to 100 for 1st slope
         lds    wr0,06h          ;063h = 99
```

```
t0202:  opp     four            ;flip-flop clock to converters
        opp     clkup
        nop
        nop
        nop
        nop
        nop
        nop opp     four            ;flip-flop clock to converters
        opp     clkdn
        nop
        nop
        nop
        subi*   wr1,1           ;sub 1 from 100 count
        sbci*   wr0,0
        bch     wt0202          ;jump if has not generated a carry sf      light           ;start 2nd slope
nv0:    opp     four            ;flip-flop clock to converters
        opp     clkup
        nop
        nop
        addi*   wr1,1           ;add to count registers
        adci*   wr0,0           ;carry
        ipa*    acc             ;read port bit0
        bab1    cntoff          ;jump on if still reading counts
        jmp     cmpoff ntoff:  opp     four            ;flip-flop clock to converters
        opp     clkdn
        nop
        nop
        addi*   wr1,1           ;add to count registers
        adci*   wr0,0           ;carry
        ipa*    acc             ;read port bit0
        bab1    cnv0            ;jump back if still reading counts
```

;compute current offset

```
off:    rf      light
        sic     inton
        lds     acc,0eh         ;resting state of the analog swithes
        opp     acc mrw     wr7,wr1         ;transfer time count to other registers
        mrw     wr6,wr0
        lds     wr5,0 addi*   wr7,8           ;add 200 to count
        adci*   wr6,0ch
        adci*   wr5,0           ;have denominator now
```

;changed the code below to 980 for CURRENT
;resolution would be 0.0x amperes

;multiply value by 980
```
        call    clrtmp
        mwr     temp1,wr0       ;transfer to count to temp registers
        mwr     temp2,wr1 lp:     lds     temp3,3         ;load 980 into registers
        lds     temp4,0dh
        lds     temp5,4
        call    multpy          ;multiply count by 980 call    divide          ;(count * 980)/(200 + count) = current in x.xx
```

```
.ff:    mwr     offst0,wr4      ;transfer to permanent registers
        mwr     offst1,wr3      ;current offset
        mwr     offst2,wr2
        mwr     offst3,wr1
fend:   rts                     ;return multiply routine
8 x 12 bit multiply , answer is 20 bits long
(temp1 - temp2) x ( temp3 - temp5 ) = wr0 - wr4 ltpy:   lds     bacc,8          ;8 bits to multiply
        lds     wr0,0
        lds     wr1,0
        lds     wr2,0
        lds     wr3,0
        lds     wr4,0
tcnt:   lda     temp1
        bab3    addrtn          ;add & shift tlp:    lda     temp2           ;shift left
        add*    temp2
        lda     temp1
        adc*    temp1 lds     acc,1
        sub*    bacc
        baz     *+2             ;jump if equal 8 times
        jmp     double
        rts drtn:   lda     temp5           ;add to answer
        add*    wr4
```

```
         lda     temp4
         adc*    wr3
         lda     temp3
         adc*    wr2
         adci*   wr1,0
         adci*   wr0,0
         jmp     mltlp
ouble:   lda     wr4             ;shift answer to left
         add*    wr4
         lda     wr3
         adc*    wr3
         lda     wr2
         adc*    wr2
         lda     wr1
         adc*    wr1
         lda     wr0
         adc*    wr0
         jmp     mltcnt          ;return to main multiply routine
         end
```
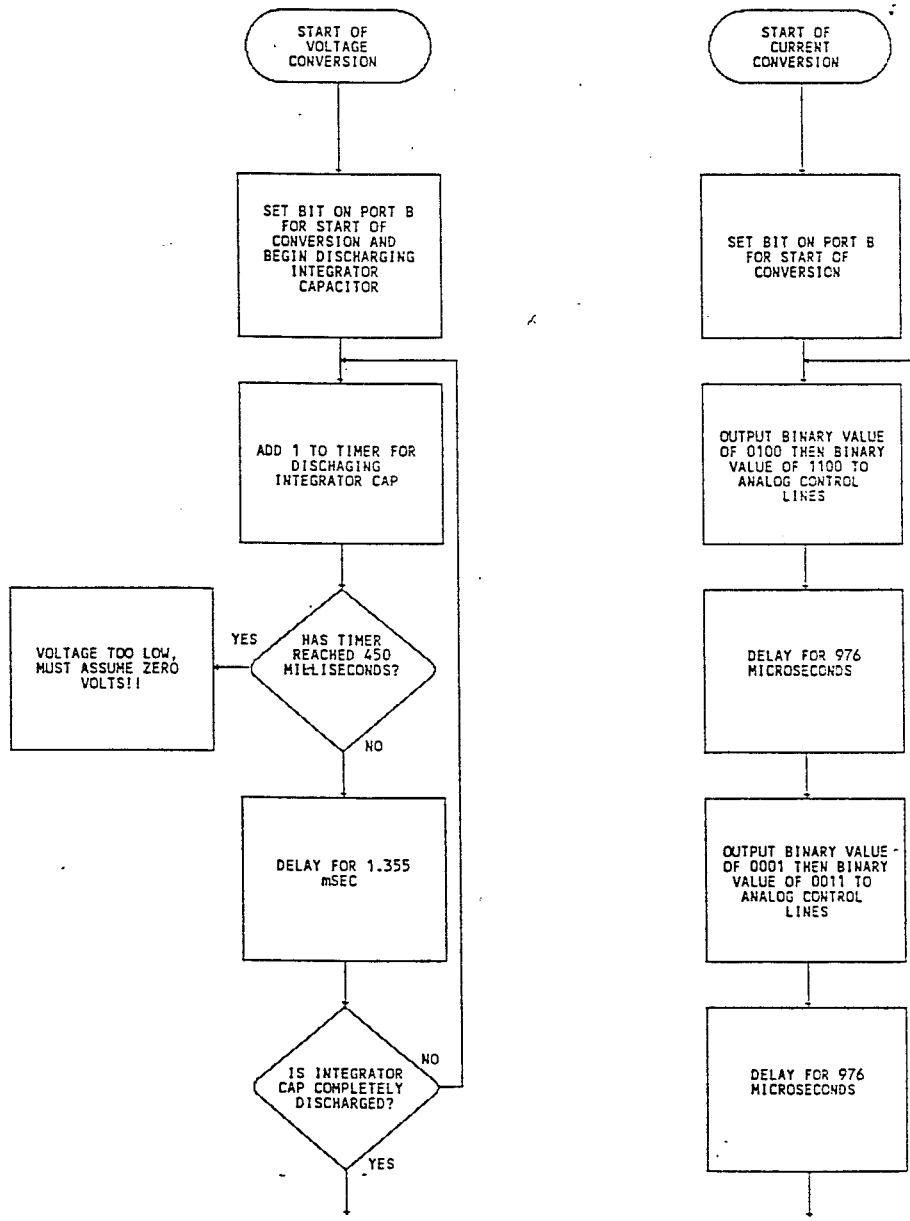

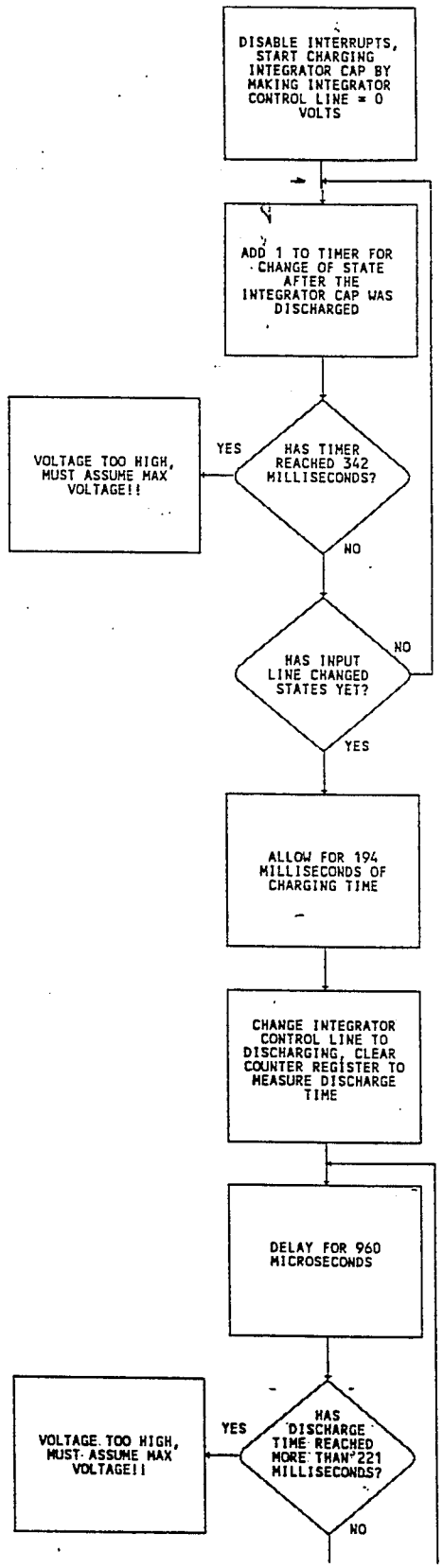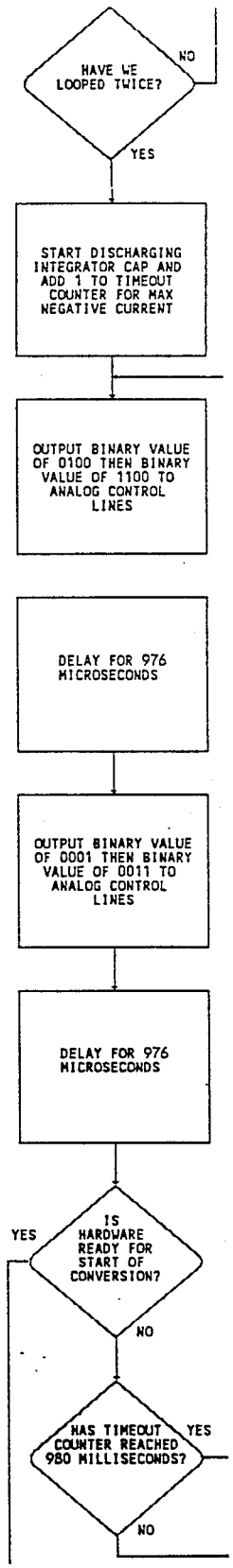

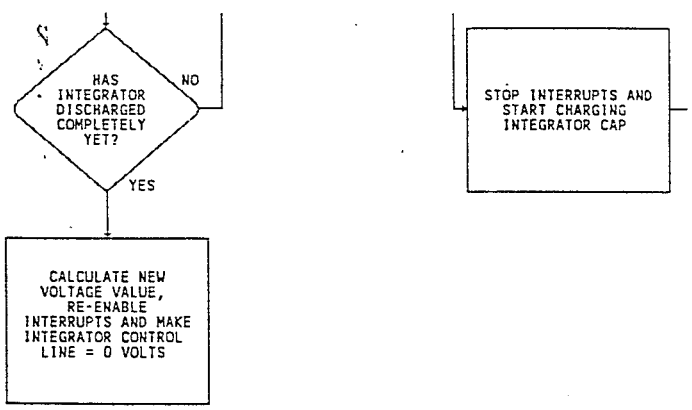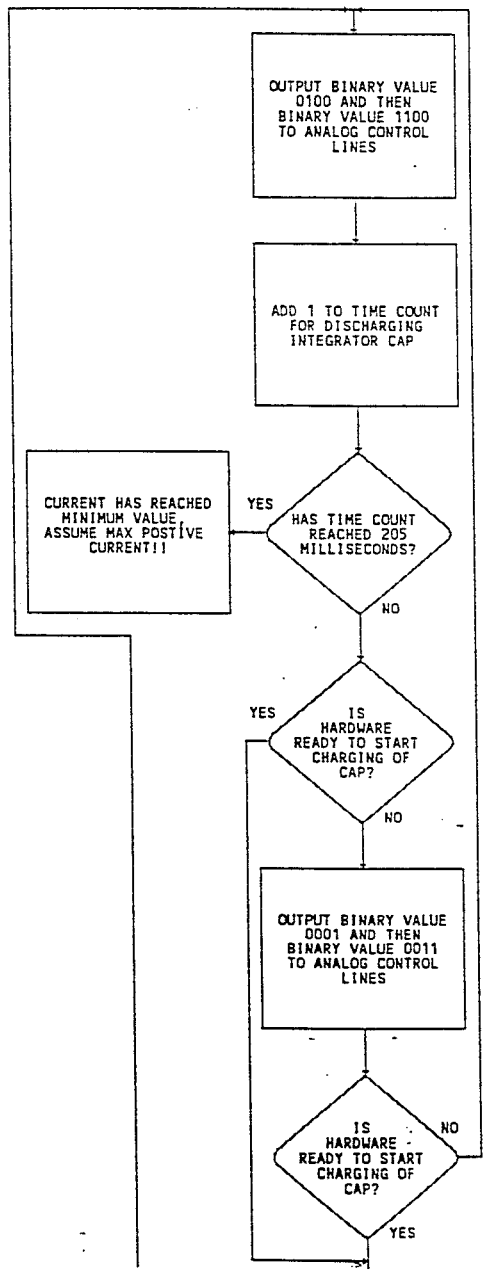

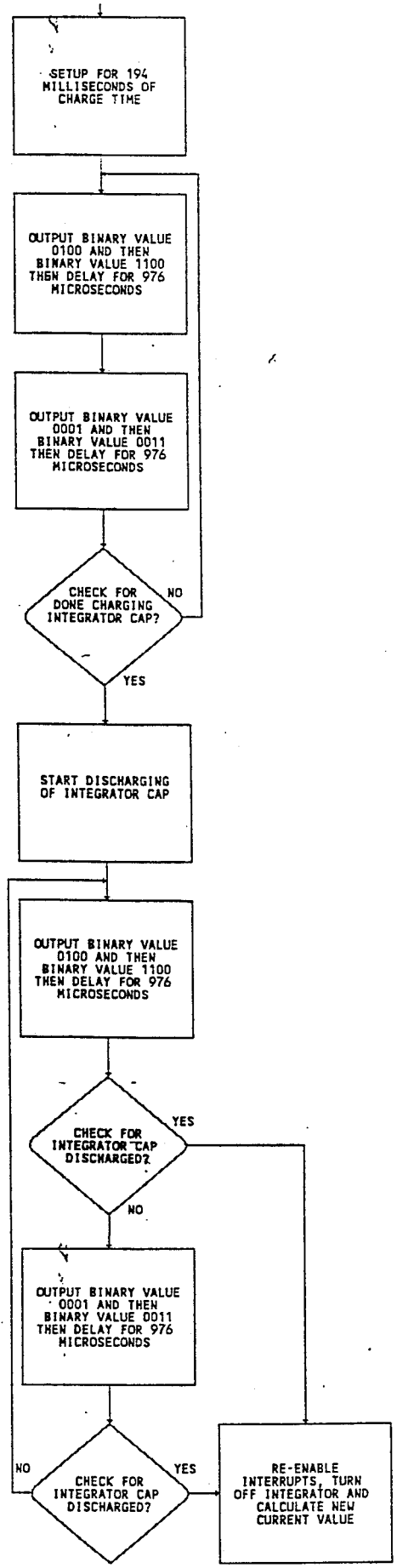

*** SEGMENT PLA ***

```
PAD NO.[38]   LCD DRIVER COM(1) NC   ................  ...C.....
                        COM(2)  ..   2...............  .........
                        COM(3) NC    ................  .........

PAD NO.[39]   LCD DRIVER COM(1)  ..  2...............  ......G.
                        COM(2)   ..  2...............  :B.......
                        COM(3) NC    ................  .........

PAD NO.[40]   LCD DRIVER COM(1)  ..  2...............A........
                        COM(2)   ..  2...............  .....F..
                        COM(3) NC    ................  .........

PAD NO.[41]   LCD DRIVER COM(1)  ..  2...............  ...D....
                        COM(2)   ..  2...............  ....E...
                        COM(3) NC    ................  .........

PAD NO.[44]   LCD DRIVER COM(1)  ..  .....7..........A........
                        COM(2)   ..  .3..............  ...C.....
                        COM(3) NC    ................  .........

PAD NO.[46]   LCD DRIVER COM(1)  ..  .3..............  ......G.
                        COM(2)   ..  .3..............  .B......
                        COM(3) NC    ................  .........

PAD NO.[47]   LCD DRIVER COM(1)  ..  .3..............A........
                        COM(2)   ..  .3..............  .....F..
                        COM(3) NC    ................  .........

PAD NO.[48]   LCD DRIVER COM(1)  ..  .3..............  ...D....
                        COM(2)   ..  .3..............  ....E...
                        COM(3) NC    ................  .........

PAD NO.[49]   LCD DRIVER COM(1)  ..  ....6...........A........
                        COM(2)   ..  ..4.............  ..C.....
                        COM(3) NC    ................  .........

PAD NO.[50]   LCD DRIVER COM(1)  ..  ..4.............  ......G.
                        COM(2)   ..  ..4.............  .B......
                        COM(3) NC    ................  .........

PAD NO.[51]   LCD DRIVER COM(1)  ..  ..4.............A........
                        COM(2)   ..  ..4.............  .....F..
                        COM(3) NC    ................  .........

PAD NO.[52]   LCD DRIVER COM(1)  ..  ..4.............  ...D....
                        COM(2)   ..  ..4.............  ....E...
                        COM(3) NC    ................  .........

PAD NO.[53]   LCD DRIVER COM(1)  ..  .....7..........  .B......
                        COM(2)   ..  ....5...........  ..C.....
                        COM(3) NC    ................  .........

PAD NO.[54]   LCD DRIVER COM(1)  ..  ....5...........  ......G.
                        COM(2)   ..  ....5...........  .B......
                        COM(3) NC    ................  .........
```

APPENDIX 2

```
******************  ************************  **********
***    LC5851H SERIES OPTION INSTRUCTION  VER 1.0    ***
***********************************************************

[ FILE NAME ]: HOPTLCD.HEX       ...R/W DIR
[ COMMENT  ]:

** MASK OPTION  LC5851H **

-- PACKAGE/CHIP --
PACKAGE         CHIP
.......         ****

------------------- LCD DRIVER -------------------
STATIC    DUPLEX      1/2B-1/3D    1/3B-1/3D      UNUSED
......    ******      .........    .........      ......

--------------- LCD FREQUENCY (DEV.IN=32.78 KHz) ---------------
SLOW(OSC/2048Hz)   TYP(OSC/1024Hz)     FAST(OSC/512Hz)      STOP
...............    **************      ...............     ....

---------------- INPUT S(1-4) ------------------
L-LEVEL HOLD Tr. USED      L-LEVEL HOLD Tr. UNUSED
**********************     .......................

---------------- INPUT M(1-4) ------------------
L-LEVEL HOLD Tr. USED      L-LEVEL HOLD Tr. UNUSED
**********************     .......................

--------- S,M PORT FREQ. ---------
SLOW(OSC/256Hz)    FAST(OSC/64Hz)
***************    ..............

----------- ALARM FREQ. -----------           ------- EXTERNAL RESET -------
FAST(OSC/16Hz)     SLOW(OSC/32Hz)             S1-4 ALL ON     "RES" TERMINAL
**************     ..............             ...........     **************

-- INTERNAL RESET CONTROL --
INHIBIT          NORMAL ACTION
*******          .............

----------- CYCLE TIME ----------       ---- INT INPUT RESISTOR ----
SLOW(OSC/8Hz)    FAST(OSC/4Hz)          PULL UP    PULL DOWN    OPEN
.............    **************         *******    .........    ....

-- INT SIGNAL EDGE --          ----------- TIMER CLOCK -----------
L --> H      H --> L           SLOW(OSC/512Hz)    FAST(OSC/8Hz)
.......      *******           ***************    .............

------------------ OSC OPTION -------------------
Xtal(32.768KHz)    Xtal(65.536KHz)      CERAMIC
***************    ...............      .......
PAD NO.[55]  LCD DRIVER COM(1) ...   ...5...........  A......
                       COM(2) ...   ...5...........  .....F..
                       COM(3) NC    ...............  ........

PAD NO.[56]  LCD DRIVER COM(1) ..    ...5...........  ...D....
                       COM(2) ..    ...5...........  ....E...
                       COM(3) NC    ...............  ........
```

```
PAD NO.[57]  LCD DRIVER COM(1)  ..     ........8........  ...C.....
                       COM(2)  ..     ........8........  ...C.....
                       COM(3)  NC     .................  .........

PAD NO.[58]  LCD DRIVER COM(1)  ..     ........8........  ....D....
                       COM(2)  ..     ........8........  ....D....
                       COM(3)  NC     .................  .........

PAD NO.[59]  LCD DRIVER COM(1)  ..     ........9........  A........
                       COM(2)  ..     ........9........  A........
                       COM(3)  NC     .................  .........

PAD NO.[60]  LCD DRIVER COM(1)  ..     ........9........  .B.......
                       COM(2)  ..     ........9........  .B.......
                       COM(3)  NC     .................  .........

PAD NO.[61]  LCD DRIVER COM(1)  ..     ........9........  ..C......
                       COM(2)  ..     ........9........  ..C......
                       COM(3)  NC     .................  .........

PAD NO.[62]  LCD DRIVER COM(1)  ..     ........9........  ...D.....
                       COM(2)  ..     ........9........  ...D.....
                       COM(3)  NC     .................  .........

PAD NO.[63]  LCD DRIVER COM(1)  NC     .................  .........
                       COM(2)  NC     .................  .........
                       COM(3)  NC     .................  .........

PAD NO.[64]  LCD DRIVER COM(1)  NC     .................  .........
                       COM(2)  NC     .................  .........
                       COM(3)  NC     .................  .........

PAD NO.[65]  LCD DRIVER COM(1)  NC     .................  .........
                       COM(2)  NC     .................  .........
                       COM(3)  NC     .................  .........

BE CAREFUL NEXT SYMBOLS

*   08 , C        -    PAD NO = 57    COM1
                   -    PAD NO = 57    COM2

*   08 , D        -    PAD NO = 58    COM1
                   -    PAD NO = 58    COM2

*   09 , A        -    PAD NO = 59    COM1
                   -    PAD NO = 59    COM2

*   09 , B        -    PAD NO = 60    COM1
                   -    PAD NO = 60    COM2

*   09 , C        -    PAD NO = 61    COM1
                   -    PAD NO = 61    COM2

*   09 , D        -    PAD NO = 62    COM1
                   -    PAD NO = 62    COM2
```

We claim:
1. An apparatus comprising
a. a load;
b. a NiCad battery coupled to said load;
c. a shunt resistor coupled in series between said battery and said load
d. a current conditioner coupled in parallel with said shunt;
e. a voltage conditioner coupled in parallel with said load wherein said voltage conditioner further comprises means for supplying a reference voltage, means coupled to said NiCad battery and said supplying means for developing a comparison signal representing the difference between said reference voltage to said voltage of said NiCad battery, means coupled to said developing means for integrating said comparison signal, and means coupled to said microprocessor and said integrating means for indicating the time of said integrating;
f. a microprocessor coupled to said current conditioner and said voltage conditioner for periodically determining current and voltage of said NiCad battery; and
g. a liquid crystal display coupled to said microprocessor for periodically displaying said current and said voltage of said NiCad battery.

2. An apparatus according to claim 1 wherein said current conditioner further comprises:
means coupled to said shunt for measuring a voltage drop across said shunt; and,
b. means coupled to said microprocessor and said measuring means for providing a signal to said microprocessor indicative of said voltage drop.

* * * * *